United States Patent
Takada et al.

(10) Patent No.: US 10,366,749 B2
(45) Date of Patent: Jul. 30, 2019

(54) MEMORY SYSTEM

(71) Applicant: Toshiba Memory Corporation, Minato-Ku (JP)

(72) Inventors: Marie Takada, Yokohama (JP); Masanobu Shirakawa, Chigasaki (JP); Hiroshi Yao, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 3 days.

(21) Appl. No.: 15/703,070

(22) Filed: Sep. 13, 2017

(65) Prior Publication Data

US 2018/0277204 A1    Sep. 27, 2018

(30) Foreign Application Priority Data

Mar. 24, 2017 (JP) .................................. 2017-060053

(51) Int. Cl.
*G11C 11/00* (2006.01)
*G11C 13/00* (2006.01)
*G11C 7/10* (2006.01)

(52) U.S. Cl.
CPC .......... *G11C 13/004* (2013.01); *G11C 7/1006* (2013.01); *G11C 13/0033* (2013.01); *G11C 13/0069* (2013.01); *G11C 13/0026* (2013.01); *G11C 2013/005* (2013.01); *G11C 2013/0042* (2013.01); *G11C 2013/0054* (2013.01); *G11C 2013/0057* (2013.01); *G11C 2213/71* (2013.01); *G11C 2213/78* (2013.01); *G11C 2213/79* (2013.01)

(58) Field of Classification Search
CPC ........................ G11C 13/0069; G11C 13/0004
USPC ......................................................... 365/148
See application file for complete search history.

(56) References Cited

U.S. PATENT DOCUMENTS

| | | | |
|---|---|---|---|
| 9,613,675 B2 * | 4/2017 | Shen | G11C 11/1673 |
| 9,911,491 B2 * | 3/2018 | Muralimanohar | G11C 13/0002 |
| 2009/0237979 A1 | 9/2009 | Mukai et al. | |
| 2013/0003451 A1 | 1/2013 | Bedeschi et al. | |
| 2013/0235647 A1 * | 9/2013 | Kim | G11C 13/0004 365/148 |
| 2014/0254242 A1 | 9/2014 | Siau | |
| 2016/0203863 A1 | 7/2016 | Chien et al. | |

FOREIGN PATENT DOCUMENTS

JP    2009-230796    10/2009
JP    5549956    7/2014

* cited by examiner

*Primary Examiner* — Hoai V Ho
(74) *Attorney, Agent, or Firm* — Oblon, McClelland, Maier & Neustadt, L.L.P.

(57) ABSTRACT

A memory system according to one embodiment includes a memory device including a memory cell with a variable resistance value and a first controller, and a second controller. The first controller is configured to compare first read data read from the memory cell when a first voltage is applied to the memory cell with second read data read from the memory cell when a second voltage is applied to the memory cell. The first voltage is different from the second voltage. The first read data has a first value or a second value with the first value being different from the second value. The second read data has the first value or the second value.

19 Claims, 25 Drawing Sheets

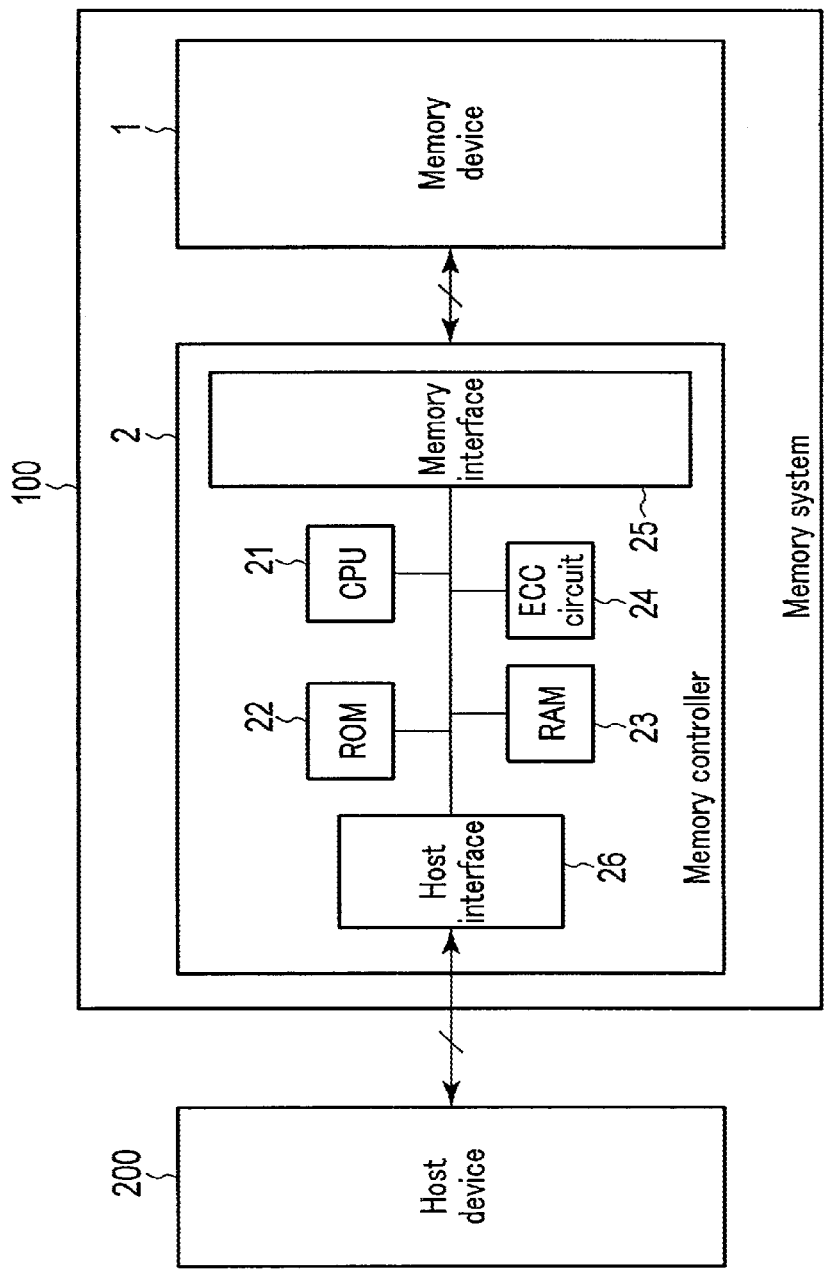
F I G. 1

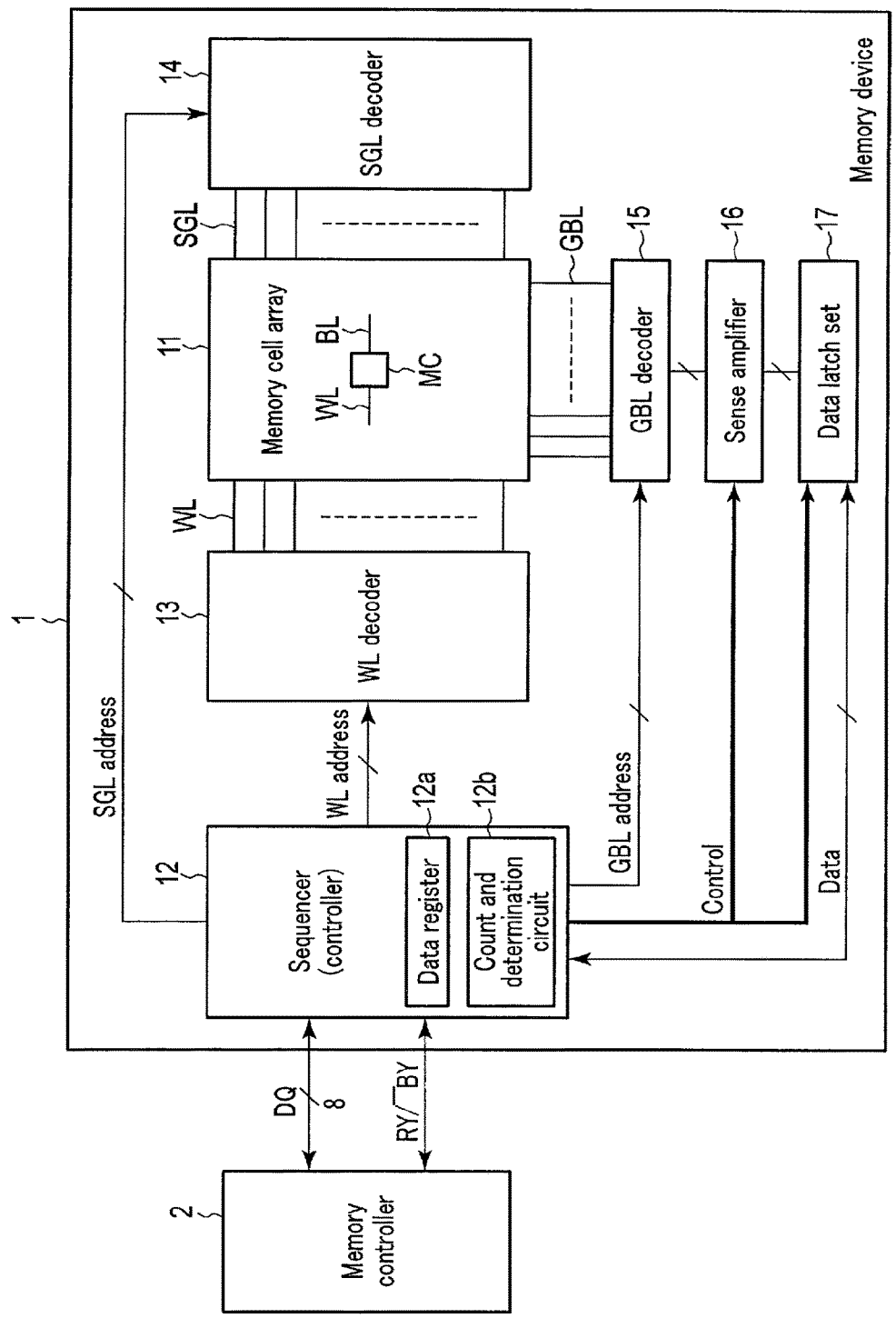
F I G. 2

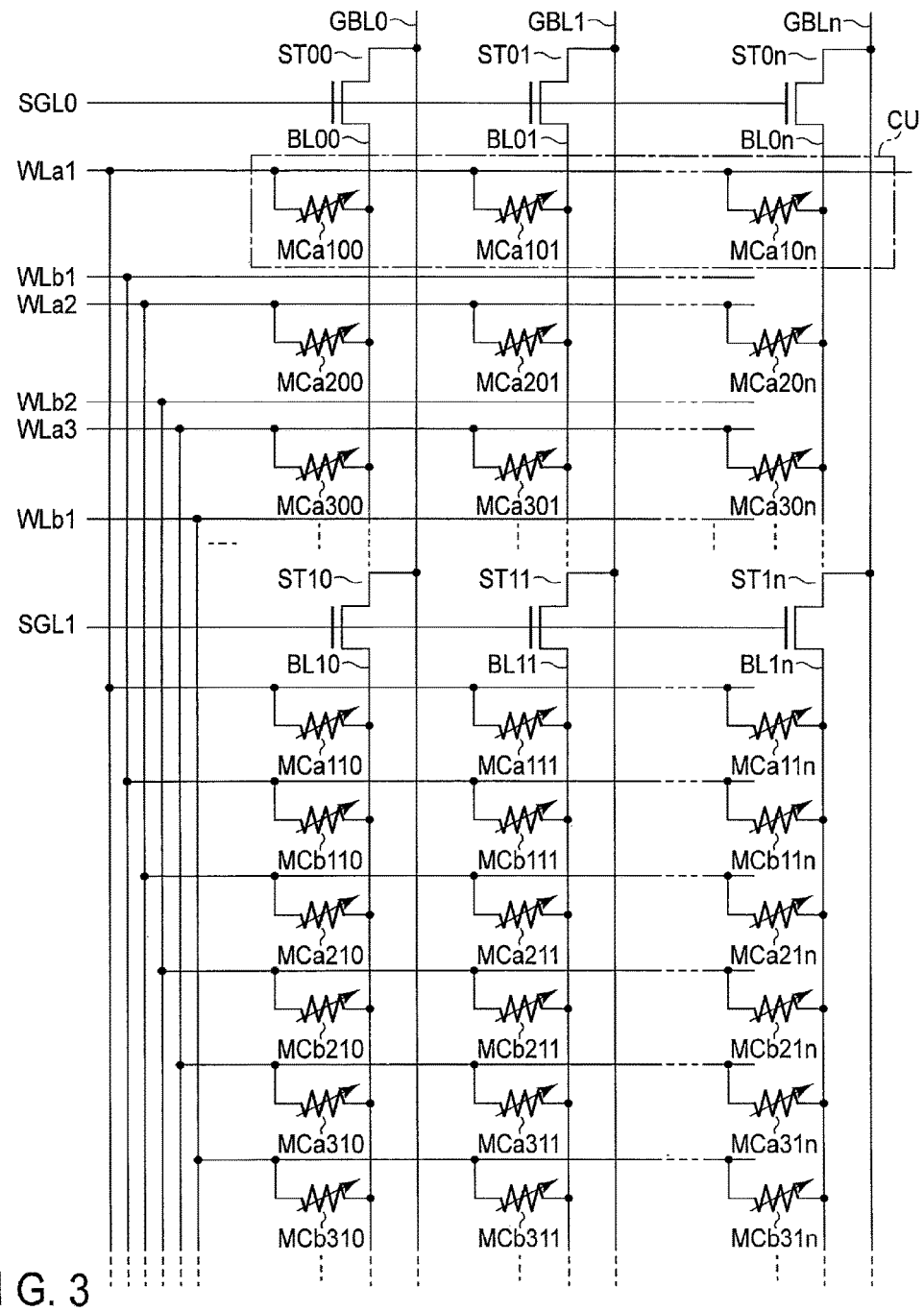
F I G. 3

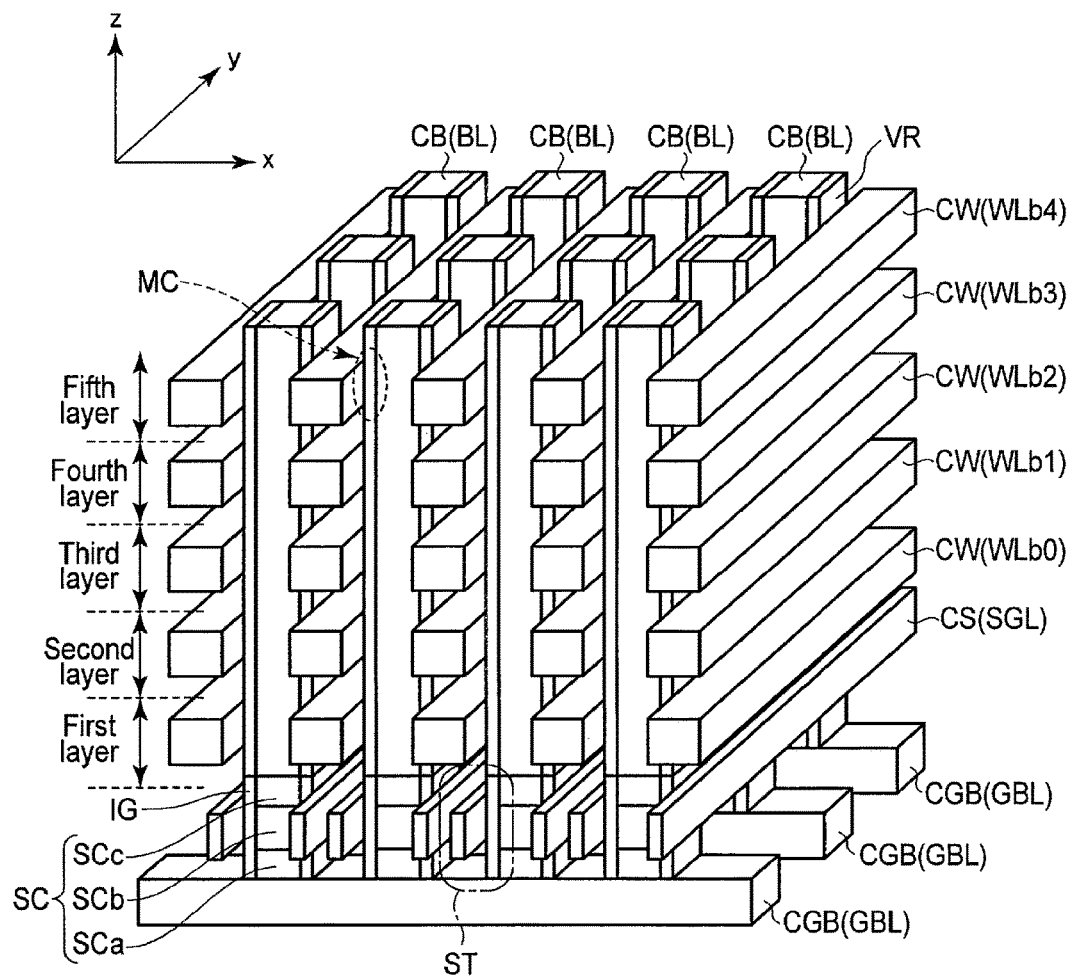
F I G. 4

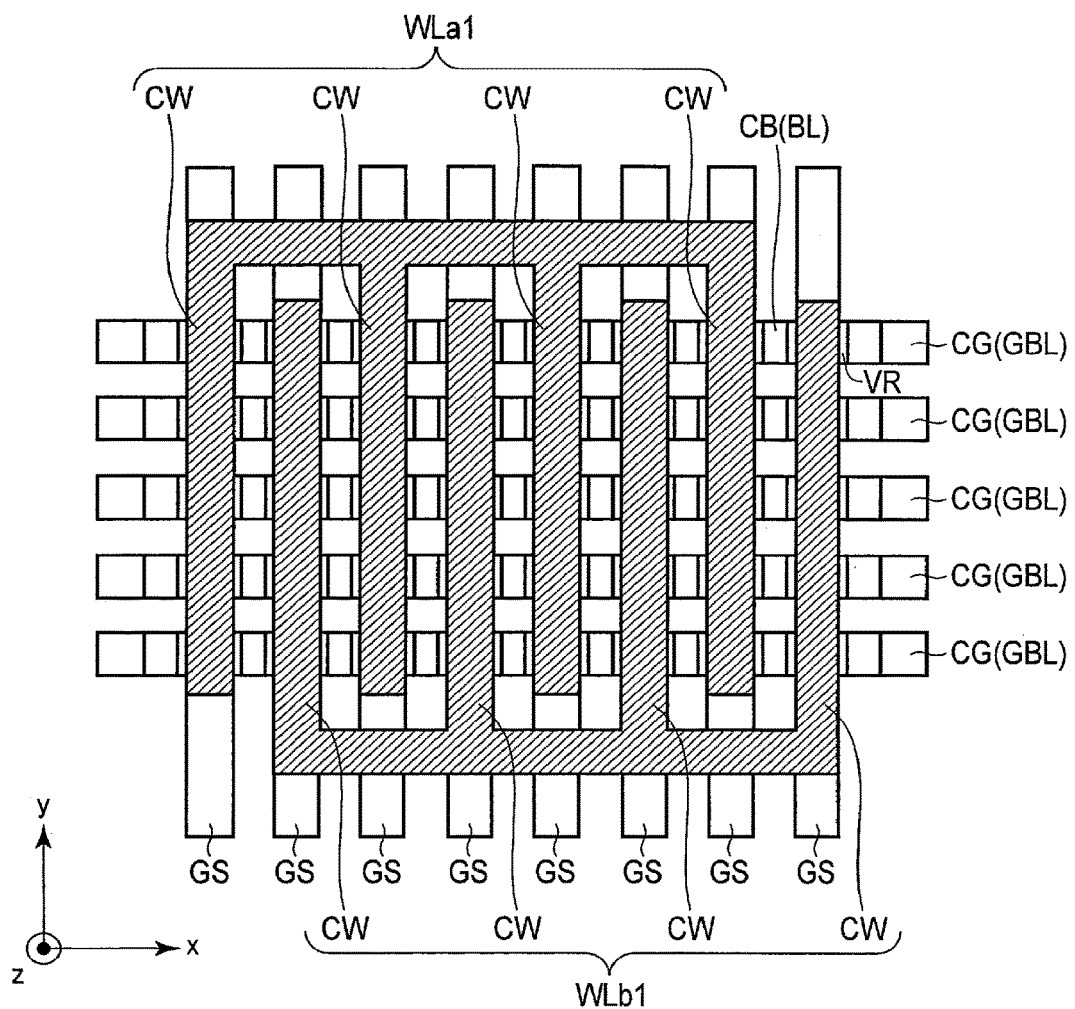
F I G. 5

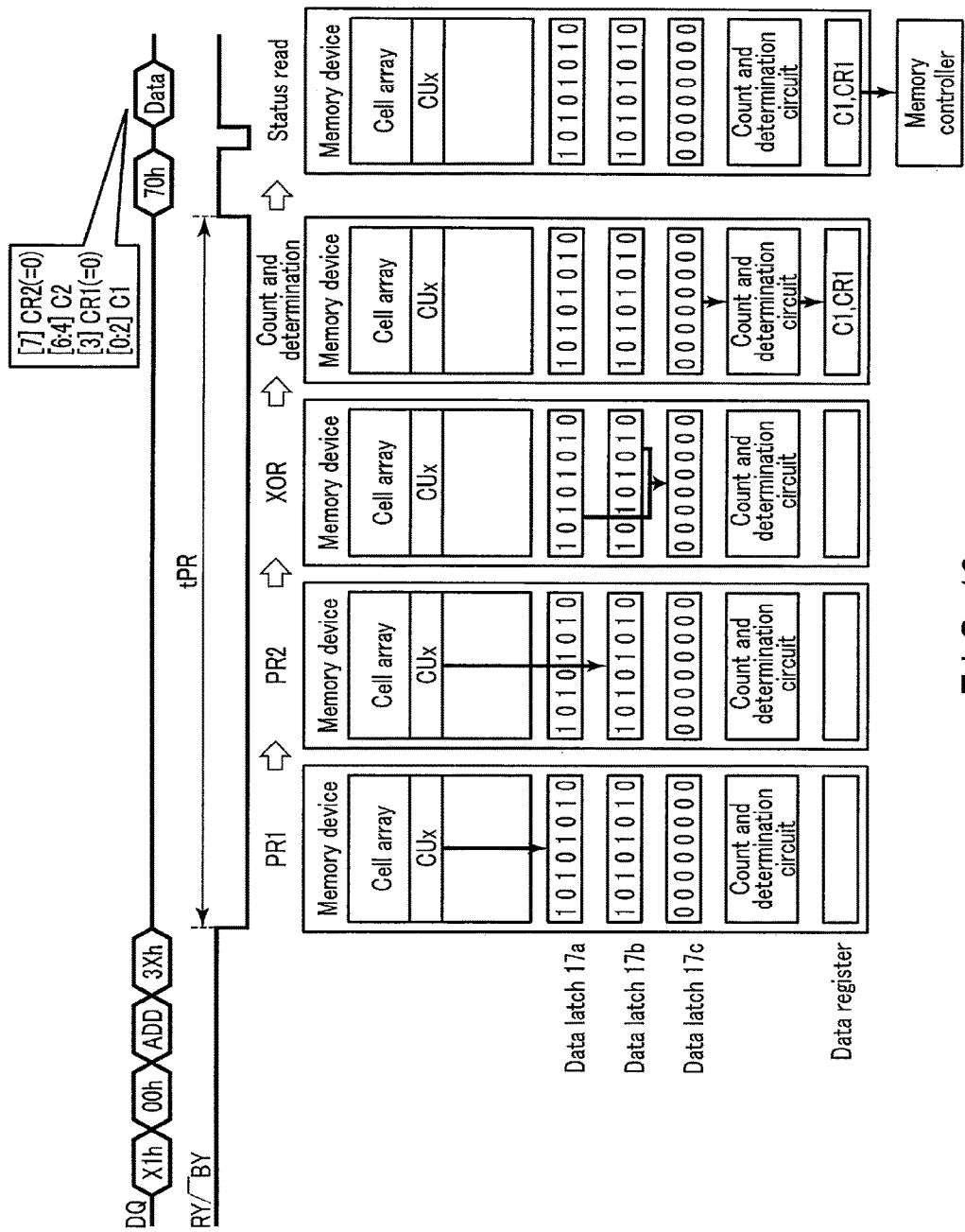
F I G. 13

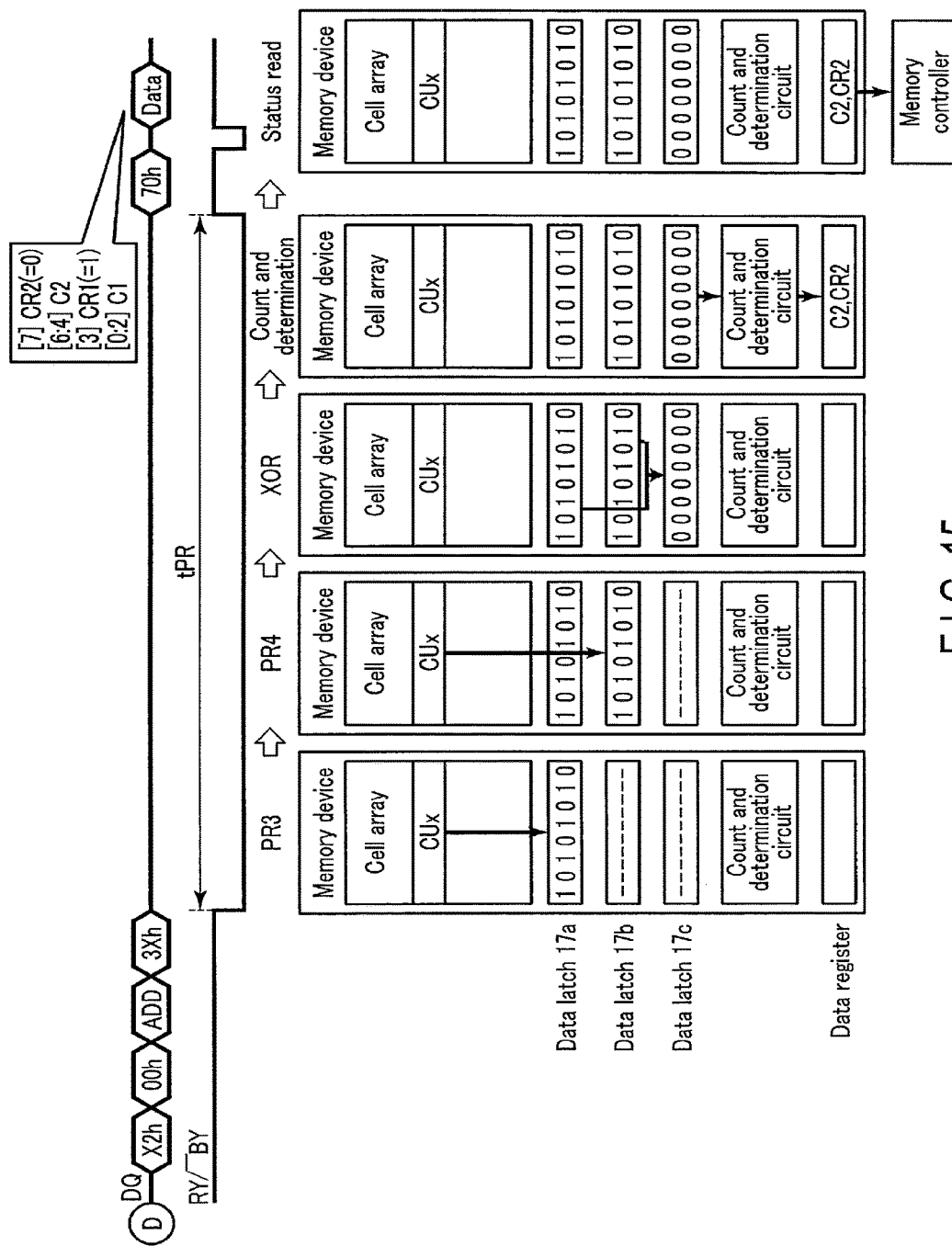
F I G. 15

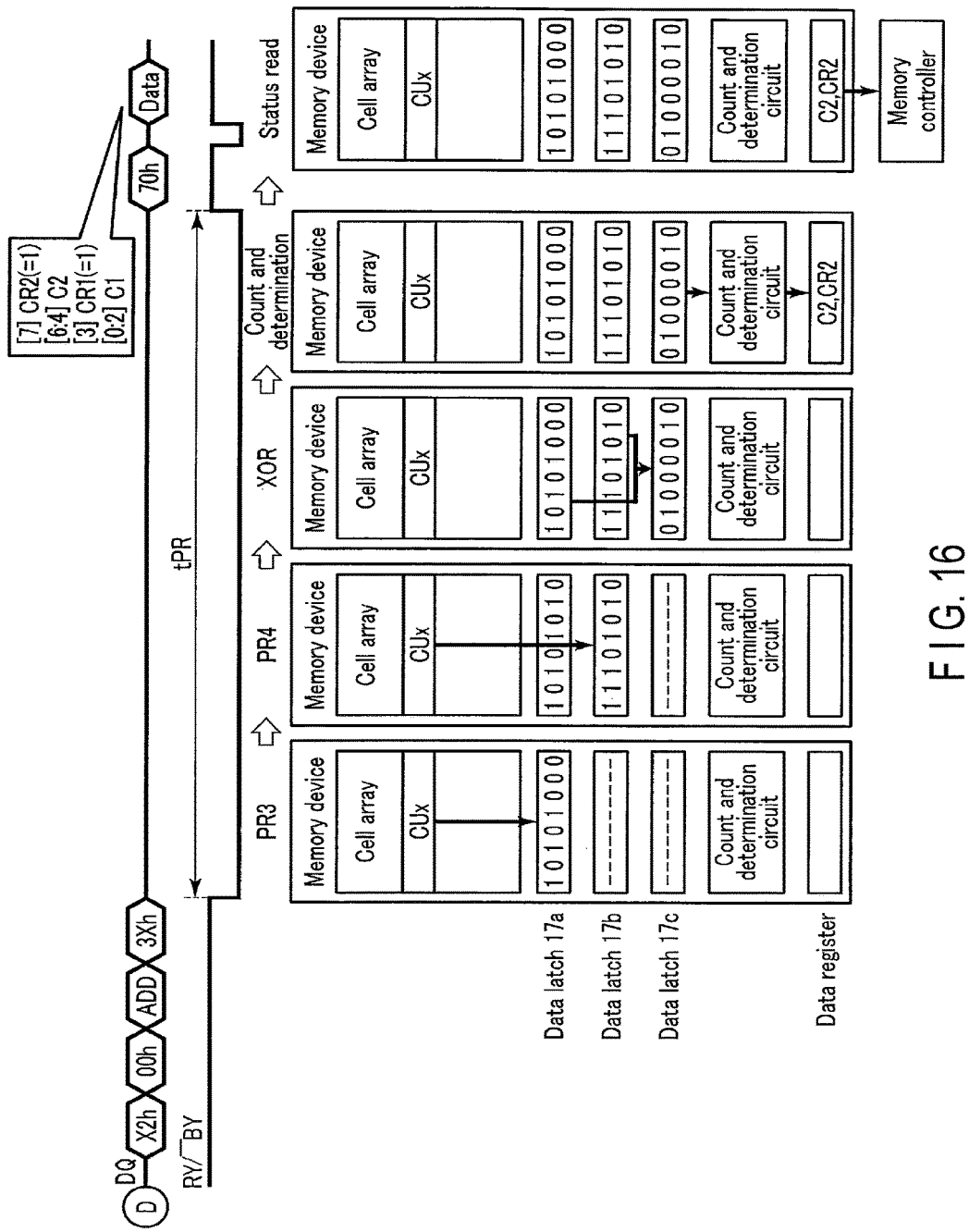
F I G. 16

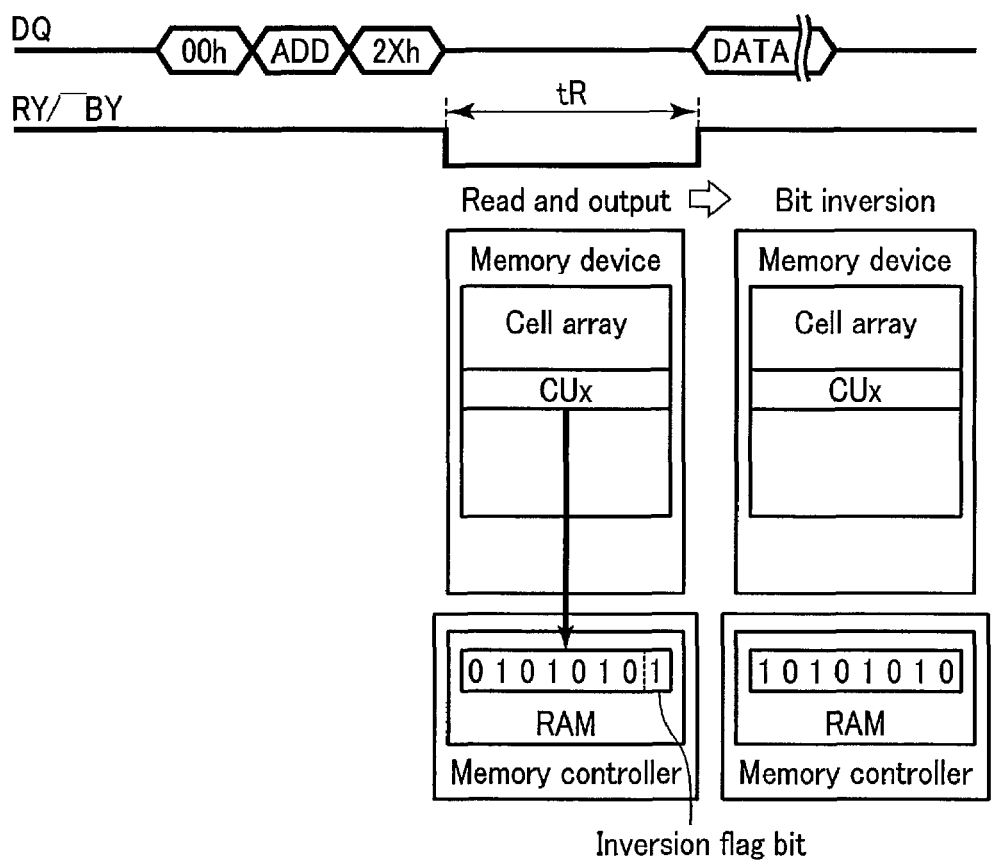
F I G. 23

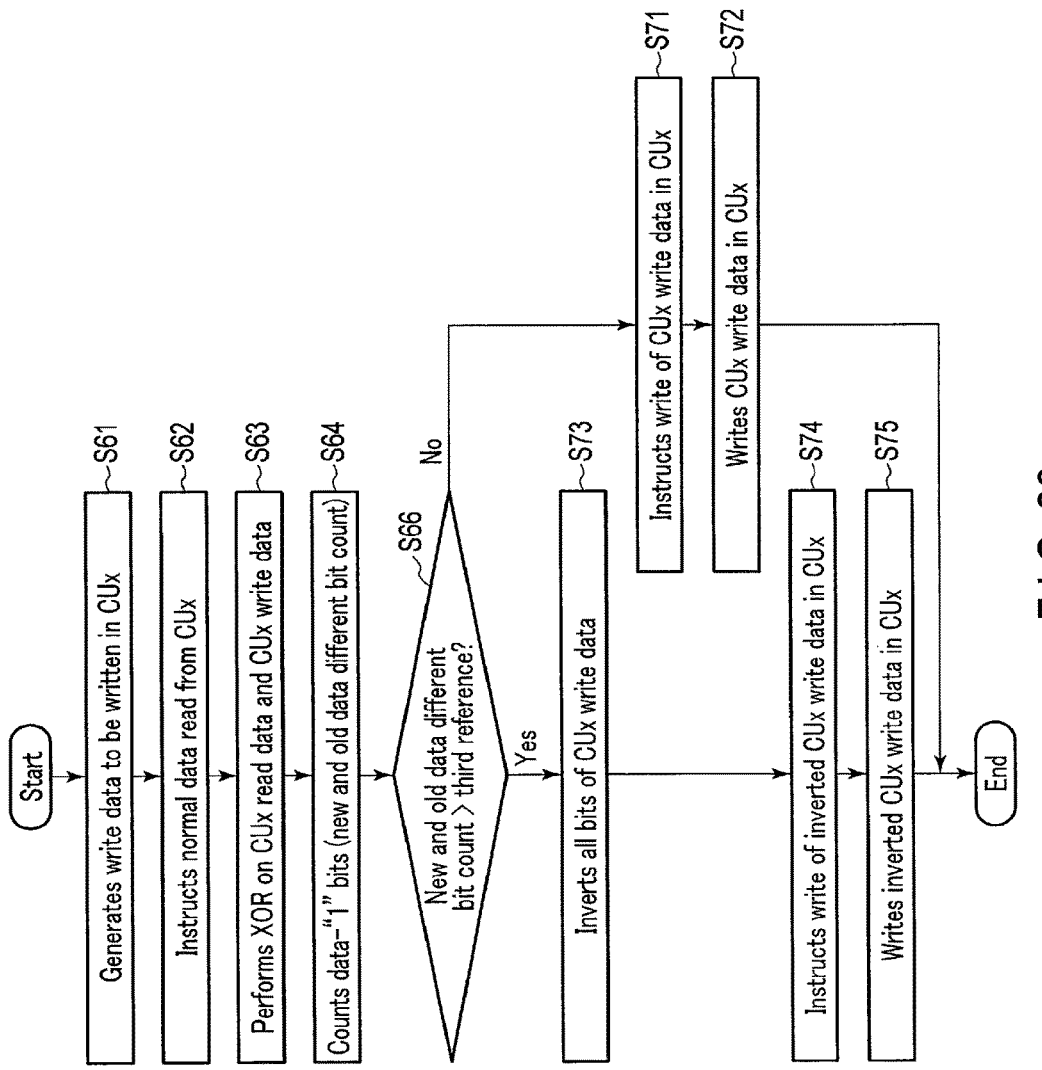
F I G. 26

US 10,366,749 B2

MEMORY SYSTEM

CROSS-REFERENCE TO RELATED APPLICATIONS

This application is based upon and claims the benefit of priority from Japanese Patent Application No. 2017-60053, filed Mar. 24, 2017, the entire contents of which are incorporated herein by reference.

FIELD

Embodiments described herein relate generally to a memory system.

BACKGROUND

A memory device referred to as a resistive random access memory (ReRAM) is known. The ReRAMs store data based on a change in a resistance value of a memory cell.

BRIEF DESCRIPTION OF THE DRAWINGS

FIG. 1 illustrates functional blocks of a memory system of a first embodiment;

FIG. 2 illustrates functional blocks of a memory device of the first embodiment;

FIG. 3 illustrates components and their connections in a part of a memory cell array of the first embodiment;

FIG. 4 illustrates a three-dimensional structure of a part of the memory cell array of the first embodiment;

FIG. 5 illustrates a cross-sectional view of a part of the memory cell array of the first embodiment;

FIG. 13 illustrates a first example of signals DQ and data in some places in a data examination in the first embodiment;

FIG. 15 illustrates a third example of the signals DQ and data in some places in the data examinations in the first embodiment;

FIG. 16 illustrates a fourth example of the signals DQ and data in some places in the data examinations in the first embodiment;

FIG. 23 illustrates an example of the signals DQ and data in some places in a data read in a fourth embodiment;

FIG. 26 illustrates an operation flow of a memory system of a sixth embodiment.

DETAILED DESCRIPTION

Figure 6:
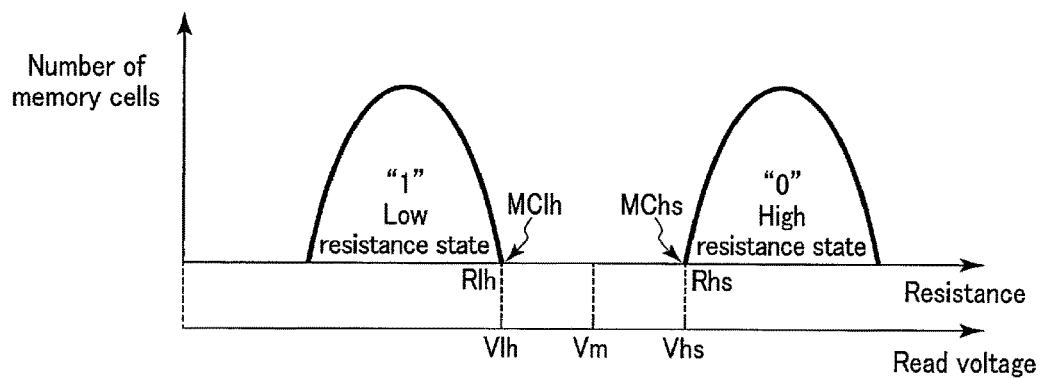
FIG. 6 illustrates distributions of resistance values of the memory cells of the first embodiment, and various read voltages.

In general, a memory system according to one embodiment includes a memory device including a memory cell with a variable resistance value and a first controller, and a second controller. The first controller is configured to compare first read data read from the memory cell when a first voltage is applied to the memory cell with second read data read from the memory cell when a second voltage is applied to the memory cell. The first voltage is different from the second voltage. The first read data has a first value or a second value with the first value being different from the second value. The second read data has the first value or the second value.

Embodiments will now be described with reference to the figures. In the following description, components with substantially the same functionalities and configurations will be referred to with the same reference numerals, and repeated descriptions may be omitted. The entire description for a particular embodiment also applies to another embodiment unless it is explicitly mentioned otherwise or obviously eliminated.

Each functional block can be implemented as hardware, computer software, or combination of the both. For this reason, in order to clearly illustrate that each block can be any of hardware, software or combination, descriptions will be made in terms of their functionalities in general. It is not necessary that functional blocks are distinguished as in the following examples. For example, some of the functions may be implemented by functional blocks different from those illustrated below by way of example.

Any steps in the flow of a method of an embodiment are not limited to a described exemplary order, and they can be permuted and/or any step can occur concurrently with another step unless explicitly mentioned or obviously required otherwise.

In the specification and the claims, a phrase of a particular first component being "coupled" to another second component includes the first component being coupled to the second component either directly or via one or more components which are always or selectively conductive.

(First Embodiment)

<1-1-1. Configuration (Structure)>

FIG. 1 illustrates functional blocks of a memory system of the first embodiment. As illustrated in FIG. 1, the memory system 100 includes a memory device 1 and a memory controller 2. The memory system 100 communicates with a host device 200.

The memory controller 2 receives commands from the host device 200, and controls the memory device 1 based on the received commands. The memory controller 2 includes components, such as a central processing unit (CPU) 21, a read only memory (ROM) 22, a RAM 23, an error correction code (ECC) circuit 24, a memory interface (I/F) 25, and a host interface (I/F) 26.

The memory controller 2 performs various operations when programs stored in the ROM 22 are executed by the CPU 21. The RAM 23 stores temporary data.

The ECC circuit 24 appends, to substantial data to be written in the memory device 1, error correction purpose data for correcting errors of the substantial data. The data to be written in the memory device 1, or write data, includes substantial data and corresponding error correction purpose data. The ECC circuit 24 detects errors in data read from the memory device 1, or read data, using the error correction purpose data in the read data, and corrects the errors, if any, to obtain correct substantial data (i.e., including no errors) in the read data.

The memory interface 25 is coupled to the memory device 1, and manages communications between the memory controller 2 and the memory device 1. The host interface 26 is coupled to the host device 200 via a bus, and manages communications between the memory controller 2 and the host device 200.

FIG. 2 illustrates functional blocks of the memory device 1. As illustrated in FIG. 2, the memory device 1 includes a memory cell array 11, a sequencer (or, controller) 12, a word line (WL) decoder 13, a gate line (SGL) decoder 14, a global bit line (GBL) decoder 15, a sense amplifier 16, and a data latch set 17.

The memory cell array 11 includes plural memory cells MC. Particular ones of the memory cells MC may configure one page. Each memory cell MC is coupled at the first end to one word line WL, and at the second end to one bit line BL. Each bit line BL is coupled to a global bit line GBL via a transistor ST (not shown). Certain plural bit lines BL are coupled to a global bit line GBL via corresponding transistors ST (not shown). Each transistor ST is turned on by a gate line SGL, and electrically couples the both ends of that transistor ST. Details of the memory cell array 11 will be described below. The bit lines BL maybe referred to as local bit lines in order to be distinguished from the global bit lines GBL.

The WL decoder 13 is coupled to the word lines WL, and includes a word line selector and a word line driver. The word line selector receives signals each indicating a word line address (WL address signals) from the sequencer 12, and selects a word line WL assigned with the WL address indicated in a received WL address signal. The word line driver applies necessary voltages to the selected word line WL and word lines WL not selected (unselected word lines WL) in reading, writing, and erasing data in accordance with the control of the sequencer 12.

The SGL decoder 14 is coupled to the gate lines SGL, and includes a gate line selector and a gate line driver. The gate line selector receives signals each indicating a gate line address (SGL address signals) from the sequencer 12, and selects a gate line SGL assigned with the gate line address indicated in a received SGL address signal. The gate line driver applies necessary voltages to the selected gate line SGL and gate lines SGL not selected in reading, writing, and erasing data in accordance with the control of the sequencer 12.

The GBL decoder 15 is coupled to the global bit lines GBL, and includes a global bit line selector and a global bit line driver. The global bit line selector receives signals each indicating a global bit line address (GBL address signals) from the sequencer 12, and selects a global bit line GBL assigned with the GBL address indicated in a received GBL address signal. The global bit line driver applies necessary voltages to the selected global bit line GBL and global bit lines GBL not selected (unselected global bit lines GBL) in reading, writing, and erasing data in accordance with the control of the sequencer 12.

The sense amplifier 16 receives a current flowing through one or more global bit lines GBL selected by the GBL decoder 15, and determines data stored in one or more read-target memory cells MC based on the received current.

The data latch set 17 stores data from the sense amplifier 16 and data from the sequencer 12, and includes plural data latches.

The sequencer 12 transmits and receives signals DQ and control signals to and from the memory controller 2. The signals DQ have a width, for example, of eight bits, are the substance of data, and include commands, data, the address signal, status data, etc. The control signals include a signal RY/BY, which indicates whether the memory device 1 is in a ready state or in a busy state, where the signal BY indicates the busy state with the low level. The memory device 1 accepts commands from the memory controller 2 in the ready state, and does not accept commands from the memory controller 2 in the busy state.

The sequencer 12 controls the sense amplifier 16 and the data latch set 17 based on the received commands and the address signals to transmit and receive data to and from the data latch set 17. The sequencer 12 also obtains a WL address, a SGL address, and a GBL address from a received address signal.

The sequencer 12 controls the WL decoder 13 and the GBL decoder 15 in data writes to generate a large potential difference between the selected word line WL and the selected global bit line BL. This potential difference changes the resistance state of an associated memory cell MC. In data reads, the sequencer 12 generates a potential difference of a magnitude small enough not to change the resistance state of an associated memory cell MC between a selected word line WL and a selected global bit line BL, and detects a current flowing through the selected global bit line BL.

The sequencer 12 includes a data register 12a, which stores data, such as status data. The status data indicates the status of the memory device 1. The sequencer 12 further includes a count and determination circuit 12b, which counts bits having particular data (or, a value) in certain data, and compares the calculation result with a particular reference.

Below-mentioned components denoted by notations of "word line WL" accompanied by suffixes of one or more alphanumeric characters are also word lines WL, and the suffixes of alphanumeric characters are used to distinguish word lines WL from each other. Below-mentioned components denoted by notations of "bit line BL" accompanied by suffixes of one or more alphanumeric characters are also bit lines BL, and the suffixes of alphanumeric characters are used to distinguish bit lines BL from each other. Below-mentioned components denoted by notations of "global bit line GBL" accompanied by suffixes of one or more alphanumeric characters are also global bit lines GBL, and the suffixes of alphanumeric characters are used to distinguish global bit lines GBL from each other. Below-mentioned components denoted by notations of "memory cell MC" accompanied by suffixes of one or more alphanumeric characters are also memory cells MC, and the suffixes of alphanumeric characters are used to distinguish memory cells MC from each other. Below-mentioned components denoted by notations of "gate line SGL" accompanied by suffixes of one or more alphanumeric characters are also gate lines SGL, and the following alphanumeric characters are used to distinguish gate lines SGL from each other. Below-mentioned components denoted by notations of "transistor ST" accompanied by suffixes of one or more alphanumeric characters are also transistors ST, and the suffixes of alphanumeric characters are used to distinguish transistors ST from each other.

<1-1-2. Memory Cell Array>

FIG. 3 illustrates some components and their connections in the memory cell array of the first embodiment.

As illustrated in FIG. 3, for each of cases of $\alpha$ being 0 to k (k being a natural number), a global bit line GBL0 is coupled to a bit line BL$\alpha$0 via a transistor ST$\alpha$0. Similarly, for each of cases of $\alpha$ being 0 to k and each of cases of $\beta$ being 0 to n (n being a natural number), a global bit line GBL$\beta$ is coupled to a bit line BL$\alpha\beta$ via a transistor ST$\alpha\beta$. For each of cases of $\alpha$ being 0 to k and each of cases of $\beta$ being 0 to n, a transistor ST$\alpha\beta$ is coupled at its gate to a gate line SGL$\alpha$.

For each of cases of $\beta$ being 0 to n and each of cases of $\gamma$ being 0 to m (m being a natural number), a bit line BL0$\beta$ is coupled to a word line WLa$\gamma$ via a memory cell MCa$\gamma$0$\beta$. Similarly, for each of cases of $\alpha$ being 0 to k and each of cases of $\beta$ being 0 to n and each of cases of $\gamma$ being 0 to m, a bit line BL$\alpha\beta$ is coupled to a word line WLa$\gamma$ via a memory cell MCa$\gamma\alpha\beta$. Furthermore, for each of cases of $\alpha$ being 0 to k and each of cases of $\beta$ being 0 to n and each of cases of $\gamma$ being 0 to m, a bit line BL$\alpha\beta$ is coupled to a word line WLb$\gamma$ via a memory cell MCb$\gamma\alpha\beta$.

A set of plural memory cells MC coupled between respective bit lines BL and one word line WL, with the bit lines BL being respectively coupled to plural transistors ST which share one gate line SGL, configures one cell set CU. The memory space provided by one cell set CU is referred to as a page. The data of each bit of one page of a particular cell set CU is stored by one memory cell MC in that cell set CU.

FIG. 4 illustrates the three-dimensional structure of a part of the memory cell array of the first embodiment, and illustrates the structure in the space defined by the x, y, and z-axes which intersect perpendicularly to each other.

Plural conductors CGB are provided above a substrate (not shown) in the z-axis direction. The conductors CGB extend along the x-axis, have intervals along the y-axis, and each of them serves as one global bit line GBL.

Semiconductors SC are provided on the top of each conductor CGB. Semiconductors SC coupled to one conductor CGB are lined up along the x-axis at intervals. The semiconductors SC include or are made of silicon, for example. Each semiconductor SC is respectively provided with insulators IG on two side surfaces opposite to each other along the x-axis. Each semiconductor SC includes portions SCa, SCb, and SCc in this order from the bottom along the z-axis.

Plural conductors CS are provided above the conductors CGB. Two conductors CS are lined up with an interval between each pair of conductors CB lined up with respect to the x-axis. The conductors CS extend along the y-axis, and are lined up along the x-axis at intervals. Each conductor CS serves as one gate line SGL, is in contact with one insulator IG on each semiconductor SC, and sandwiches the portion SCb of each semiconductor SC via insulator IG on that semiconductor SC. One portion SCb, one conductor CS, and the insulator IG between that portion SCb and that conductor CS form one transistor ST. A part of the portion SCa and a part of the portion SCc of one semiconductor SC serve as source/drain areas of one transistor ST. A part of the portion SCb of one semiconductor SC serves as the channel region of one transistor ST.

A conductor CB is provided on the top of each semiconductor SC. The conductors CB extend along the z-axis, and each of them serves as one bit line BL (BL0, BL1, . . . ).

Each conductor CB is respectively provided with variable resistance layers VR on two side surfaces opposite to each other along the x-axis. A variable resistance layer VR includes or is made of a variable resistance material which can have continuously varying resistance. The variable resistance material comes to be in a state of having lower resistance when the variable resistance material is applied with a voltage. A variable resistance material transitions to a state of having higher resistance when a current flows through the variable resistance material. Such variable resistance materials include at least one of materials, such as HfO, TiO$_2$, ZnMn$_2$O$_4$, NiO, SrZrO$_3$ and Pr$_{0.7}$Ca$_{0.3}$MnO$_3$, and C. The variable resistance materials also include at least one of a polycrystalline or amorphous Si, or one of Ge, SiGe, GaAs, InP, GaP, GaInAsP, GaN, SiC, SiO, SiON, SiN, HfSiO, and AlO. Furthermore, the variable resistance layer VR may include a stack of layers made of the materials described above.

An electrode (not shown) may also be provided between a conductor CB and a variable resistance layer VR. The materials of the electrode include Ag, Au, Ti, Ni, Co, Al, Fe, Cr, Cu, W, Hf, Ta, Pt, Ru, Zr, Ir, or the nitride or carbide of those materials. Moreover, the electrode can be made of polycrystalline silicon with one or more materials described above added.

Plural layers of conductors CW are provided above the conductors CS. Different layers are located at different z-axis coordinates. FIG. 4 illustrates an example of five layers, i.e., an example of $\beta$=5, and the first to fifth layers are lined up in this order from the bottom along the z-axis. Each layer includes plural conductors CW. The conductors CW extend along the y-axis, and are lined up along the x-axis at intervals. Two conductors CW adjacent in each layer sandwich one conductor CB, and are in contact with two variable resistance layers VR on that conductor CB, respectively. A first set of every other one of conductors CW in each layer is coupled to each other at their respective first ends, and the first set of conductors CW and a conductor coupling the same make a comb shape structure as illustrated in the FIG. 5, which illustrates the structure along the plane made of the x and y-axes. Similarly, a second set of every other one of conductors CW in each layer is coupled to each other at their respective second ends, and the second set of conductors CW and a conductor coupling the same make a comb shape structure as illustrated in FIG. 5. For each of cases of $\gamma$ being 0 to n, the first set of conductors CW of a $\gamma^{th}$ layer serves as a word line WLa$\gamma$, and the second set of conductors CW of a $\gamma^{th}$ layer serves as a word line WLb$\gamma$. FIG. 5 illustrates the first layer.

The portion of each variable resistance layer VR sandwiched by one conductor CW and one conductor CB serves as one memory cell MC.

<1-1-3. Memory Cells>

The memory cells MC are brought into a low resistance state or a high resistance state by writes. As illustrated in FIG. 6, data is written in a memory cell MC so that the memory cell MC in a low resistance state immediately after being written in has a resistance value lower than or equal to a particular resistance value Rlh, and the memory cell MC in a high resistance state immediately after being written in has a resistance value higher than or equal to a particular resistance value Rhs. Even if memory cells MC are in the high resistance state, they may have different resistance values due to variations of characteristics of the memory cells MC, sense amplifier 16 and/or the interconnects. Similarly, even if memory cells MC are in the low resistance state, they may have different resistance values. For this reason, the resistance values of particular memory cells MC in the same resistance state form a distribution.

Among the memory cells MC in the low resistance state, the memory cells MClh with the maximum resistance value have the resistance value Rlh. In contrast, among the memory cells MC in the high resistance state, the memory cell MChs with the minimum resistance value has the resistance value Rhs. The memory device 1 operates so as to produce a large difference between the resistance values Rlh and Rhs for memory cells MC immediately after being written in.

Figure 7:
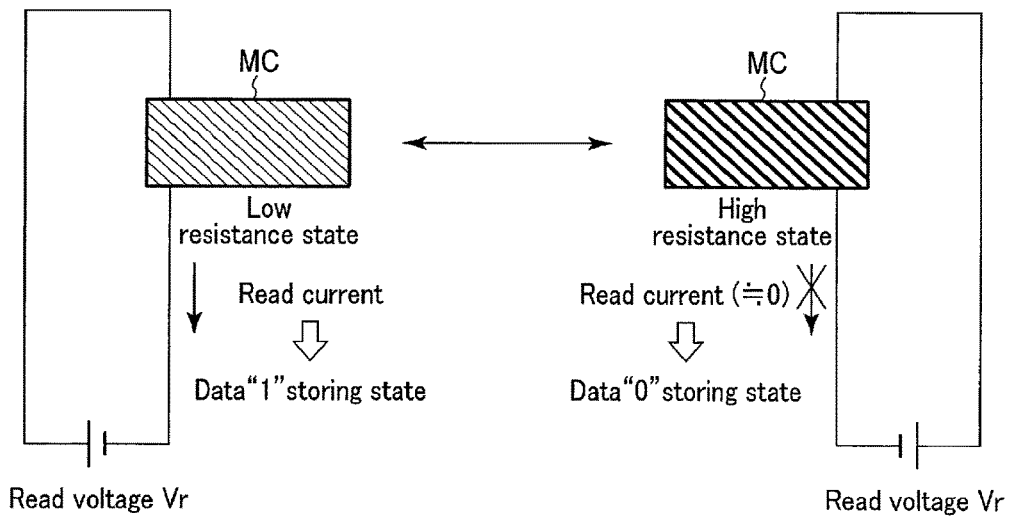
FIG. 7 illustrates features of resistance states of a memory cell of the first embodiment.

The memory cells MC store data based on resistance states thereof, and, therefore, the resistance values of the memory cells MC is determined to read data. To this end, as illustrated in FIG. 7, a read voltage Vr of a particular magnitude is applied to a read-target memory cell MC, and based on the magnitude of a resultant current flowing through the memory cell MC, the resistance values of the memory cell MC is determined by the sense amplifier 16. So long as data is written so as to produce an interval between the two resistance value distributions and an appropriate read voltage Vr is used, the sense amplifier 16 is allowed to determine in which of the two resistance states the memory cell MC is through the application of the read voltage Vr. A particular memory cell MC in the low resistance state has low resistance like a conductor, and therefore a read current of a magnitude larger than or equal to a particular magnitude flows through the memory cell MC when applied with the read voltage Vr of a particular magnitude. In contrast, a memory cell MC in the high resistance state has high resistance like an insulator, and therefore only a read current of a magnitude smaller than or equal to a particular magnitude flows even when applied with the read voltage Vr. The sense amplifier 16 determines that the memory cell MC stores data "0" when the read current has a magnitude lower than or equal to a reference, and determines that the memory cell MC stores data "1" when the read current has a magnitude larger than the reference. A memory cell MC of a resistance which allows a read current larger than or equal to a reference to flow through the same may be treated as storing data "0", and a memory cell MC of a resistance which allows a read current smaller than or equal to the reference to flow through the same may be treated as storing data "1".

As illustrated in FIG. 6, in normal data reads in the memory device 1, a normal read voltage Vm is applied to the memory cells MC. The normal read voltage Vm has a magnitude between the read voltages Vlh and Vhs. The read voltage Vlh, when applied to the memory cells MC in the low resistance state just after data are written in, has a sufficient magnitude to determine that any of those memory cells MC are in the low resistance state. The read voltage Vhs, when applied to the memory cells MC in the high resistance state just after data are written in, has a sufficient magnitude to determine that any of those memory cells MC are in the high resistance. With a read voltage smaller than or equal to the read voltage Vlh used for a data read, some memory cells MC including the memory cells MClh with the maximum resistance value may be erroneously determined to be in the high resistance state. With a read voltage larger than or equal to the read voltage Vhs used for a data read, some memory cells MC including the memory cells MChs with the minimum resistance value may be erroneously determined to be in the low resistance state.

<1-1-4. Sense Amplifier and Data Latch Set>

Figure 8:
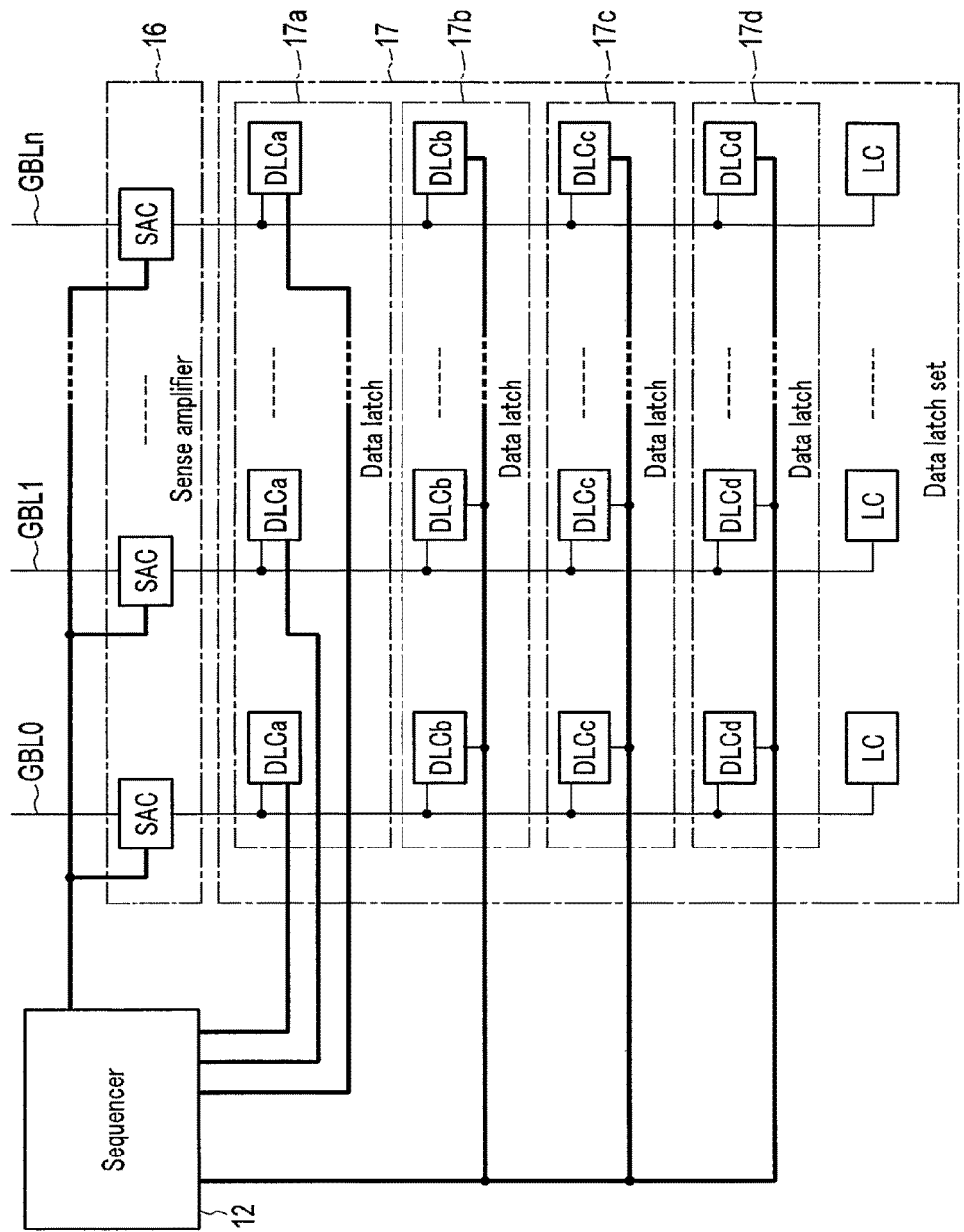
FIG. 8 illustrates components and their connections in a data input and output circuit of the first embodiment.

FIG. 8 illustrates components and their connections in the sense amplifier 16 and the data latch set 17. The thick lines in FIG. 8 represent transmission of control signals.

The sense amplifier 16 includes n+1 sense amplifier circuits SAC. The sense amplifier circuits SAC all have the same set of components and connections, and are coupled to global bit lines GBL (GBL0, GBL1, . . . ), respectively. In a data read, each sense amplifier circuit SAC is electrically coupled to one read-target memory cell MC via a global bit line GBL and one bit line BL coupled to (corresponding to) that sense amplifier circuit SAC. Each sense amplifier circuit SAC senses the electrical current flowing on the corresponding bit line BL, and determines to which of the two resistance states the corresponding memory cell MC belongs based on the result of the sensing. Each sense amplifier circuit SAC comes to store data "0" or data "1" based on the two resistance states as a result of the sensing.

The data latch set 17 includes data latches 17a, 17b, 17c, and 17d and plural operation circuits LC. The data latches 17a, 17b, 17c, and 17d each may store one-page size data. The data latch 17a includes n+1 data latch circuits DLCa. The data latch 17b includes n+1 data latch circuits DLCb. The data latch 17c includes n+1 data latch circuits DLCc. The data latch 17c includes n+1 data latch circuits DLCd. The data latch circuits DLCa, DLCb, DLCc, and DLCd are commonly referred to as data latch circuits DLC when they may not be distinguished from each other. Each data latch circuit DLC may store one-bit data.

The data latch 17d is used for inputting and outputting data from and to the memory controller 2 and the memory device 1, for example. Data received from the memory controller 2 is first input into the data latch 17d, and data output from the memory device 1 is transmitted from the data latch 17d.

One data latch circuit DLC of each of data latches 17a, 17b, 17c, and 17d is coupled to one sense amplifier circuit SAC. The sense amplifier circuit SAC and the data latch circuits DLCa, DLCb, DLCc, and DLCd coupled mutually treat bits at the same position in respective data of a one-page size in the sense amplifier 16 and data latches 17a, 17b, 17c, and 17d, respectively.

<1-2. Operation>

Prior to descriptions of operations of the memory system 100, read voltages used in the operations of the memory system 100 are described.

Figure 9:
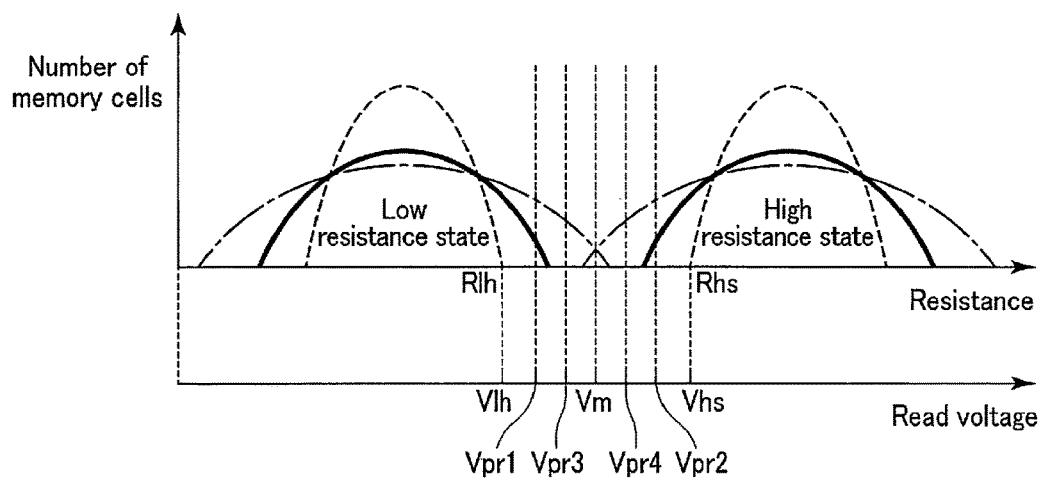
FIG. 9 illustrates read voltages used in the memory system of the first embodiment.

FIG. 9 illustrates read voltages used in the memory system 100 of the first embodiment, and distributions of the resistance values of the memory cells MC. FIG. 9 illustrates the same resistance value distributions as those in FIG. 6 with dashed lines. FIG. 9 also illustrates, with solid lines and alternate long and short dash lines, distributions of the resistance values of memory cells MC after a particular time has lapsed since a data write. When a memory cell MC with data having written in experiences data reads and/or a time has lapsed since then, the memory cell MC may come to have a resistance value different from that immediately after the data write. The distributions of the solid lines and the alternate long and short dash lines illustrate examples of such deformed resistance value distributions. An extension width of the resistance value distribution is correlated with deterioration of conditions of the memory cells MC since those immediately after the write.

The changes in the resistance values of the memory cells MC cause some memory cells MC in the low resistance state to have resistance values higher than those before being changed. Such memory cells MC may be erroneously determined to be in the high resistance state with the normal read voltage Vm used, which means a likelihood of incorrectly reading data written in (or, data expected from) those memory cells MC.

Similarly, the changes in the resistance values of the memory cells MC cause some memory cells MC in the high resistance state to have resistance values lower than those before being changed. Such memory cells MC may also be erroneously determined to be in the low resistance state with the normal read voltage Vm used, which means a likelihood of incorrectly reading data written in those memory cells MC.

Even if a read-target cell set CU, or a selected cell set CU, includes memory cells MC from which expected data are not correctly read, error bits in the data read from the selected cell set CU (read data) may be corrected by the ECC circuit 24 so long as the selected cell set CU includes only a small number of such memory cells MC (i.e. a small number of error bits). In contrast, with too many error bits in the read data, the ECC circuit 24 may not correct the error bits, and an ECC error may occur. Specifically, if reading data from a selected cell set CU with a particular read voltage results in too many memory cells MC being erroneously determined to be in the high resistance state, such a reading leads to the ECC error. Similarly, if reading data from a selected cell set CU with a particular read voltage results in too many memory cells MC being erroneously determined to be in the low resistance state, such a reading leads to the ECC error.

How many error bits are allowed in the data read from a selected cell set CU before the read data is input into the ECC circuit 24 depends on a performance required for the memory system 100. For example, a one-bit error may be acceptable in read data of one cell set CU, or even a one-bit error may be unacceptable in read data of one cell set CU. By way of example, the following descriptions are based on a case where no bit error is accepted in read data of one cell set CU. An embodiment where errors of one or more bits are acceptable in read data of one cell set CU may be implemented based on the principle described in the following.

The memory system 100 tries to beforehand identify a cell set CU storing read data which is subjected to error correction by the ECC circuit 24 now or in the near future if the read data is obtained through a data read with the normal read voltage Vm, or a normal data read. To this end, the memory system 100 uses read voltages Vpr1, Vpr2, Vpr3, and Vpr4. The read voltage Vpr1 is higher than the read voltage Vlh and lower than the normal read voltage Vm. The read voltage Vpr2 is higher than the normal read voltage Vm and lower than the read voltage Vhs. The read voltage Vpr3 is higher than the read voltage Vpr1 and lower than the normal read voltage Vm. The read voltage Vpr4 is higher than the normal read voltage Vm and lower than read voltage Vpr2. The read voltages Vpr1, Vpr2, Vpr3, and Vpr4 further satisfy the following conditions.

As described below, cell sets CU with resistance states deteriorated a little are identified with the application of the read voltages Vpr1 and Vpr2. With the application of the read voltages Vpr3 and Vpr4, cell sets CU with resistance states deteriorated moderately are identified. With the read voltage Vpr1 too close to the voltage Vlh, and/or the read voltage Vpr2 too close to the voltage Vhs, cell sets CU deteriorated not so much are unintentionally identified. In contrast, with the read voltage Vpr1 and/or the read voltage Vpr2 too close to the read voltage Vm, cell sets MC with resistance states deteriorated a little before deteriorated moderately may not be identified. Similarly, with the read voltage Vpr3 and/or the read voltage Vpr4 too close to the read voltage Vm, cell sets MC with resistance states deteriorated moderately before deteriorated severely may not be identified. In light of these, the read voltages Vpr1, Vpr2, Vpr3, and Vpr4 are determined based on resistance state deterioration desired to be identified.

The read voltage Vpr3 has a magnitude to identify cell sets CU which may be subjected to error correction by the ECC circuit 24 now or in the near future when read with the normal data read, and is determined based on an acceptable possibility that an error correction is needed when read with the normal data read. When a particular memory cell MC in the low resistance state has a resistance value significantly higher than that immediately after the data write, data read from that memory cell MC may not include an error with the normal read voltage Vm used, but may include an error with the read voltage Vpr3 used. Such a memory cell MC may come to have a resistance value high enough to be determined to store erroneous data when read in the near future with the normal read voltage Vm used, or it may be actually determined to store erroneous data with the normal data read depending on the conditions of the read. Identifying such a memory cell MC is advantageous. To this end, selection of a magnitude of the read voltage Vpr3 allows memory cells MC with resistances higher than or equal to a particular magnitude to be identified separately from other memory cells MC. In light of this, the read voltage Vpr3 is determined based on an acceptable possibility that an error correction is needed in the normal data read. The lower the read voltage Vpr3, the earlier the memory cells MC which may come to be subjected to the error correction in the normal data read in the near future may be detected.

Similarly, the read voltage Vpr4 has a magnitude to identify cell sets CU which may be subjected to error correction by the ECC circuit 24 when read now or in the near future with the normal data read, and is determined based on an acceptable possibility that an error correction is needed when read with the normal data read. When a particular memory cell MC in the high resistance state has a resistance value significantly lower than that immediately after the data write, data read from that memory cell MC may not include an error with the normal read voltage Vm used, but may include an error with the read voltage Vpr4 used. Such a memory cell MC may come to have a resistance value low enough to be determined to store erroneous data when read in the near future with the normal read voltage Vm used, or it may be actually determined to store erroneous data with the normal data read depending on the conditions of the read. Identifying such a memory cell MC is advantageous. To this end, selection of a magnitude of the read voltage Vpr4 allows memory cells MC with resistances lower than or equal to a particular magnitude to be identified separately from other memory cells MC. In light of this, the read voltage Vpr4 is determined based on an acceptable possibility that an error correction is needed in the normal data read. The higher the read voltage Vpr4, the earlier the memory cells MC which may come to be subjected to the error correction with the normal data read in the near future may be detected.

Figure 10:
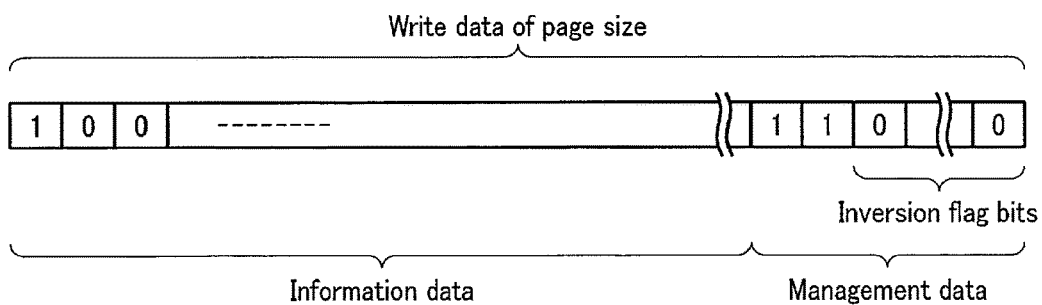
FIG. 10 illustrates details of data to be written in a cell set in the memory system of the first embodiment.

Referring to FIG. 10, write data of one-page size which is to be written in a cell set CU will be described. The memory controller 2 includes, in the write data, data for management for that write data. Specifically, the one-page size write data includes information data and management data, as illustrated in FIG. 10. The management data includes one or more inversion flag bits. Use of the inversion flag bits is described below. Upon instruction of a data write to the memory device 1, the memory controller 2 transmits a one-page size write data including inversion flag bits of a fixed value or a fixed pattern to the memory device 1. For application of one inversion flag bit, the fixed value is data "1", and, for application of plural inversion flag bits, each of the bits is data "1". When the plural inversion flag bits are used, the fixed pattern includes a predetermined combination of data "0" and data "1". The memory controller 2 sets the values indicative of no data inversion to the inversion flag bits in the normal data write, or a data write other than a data write in which data with inverted data of bits, which will be described below.

Figure 11:
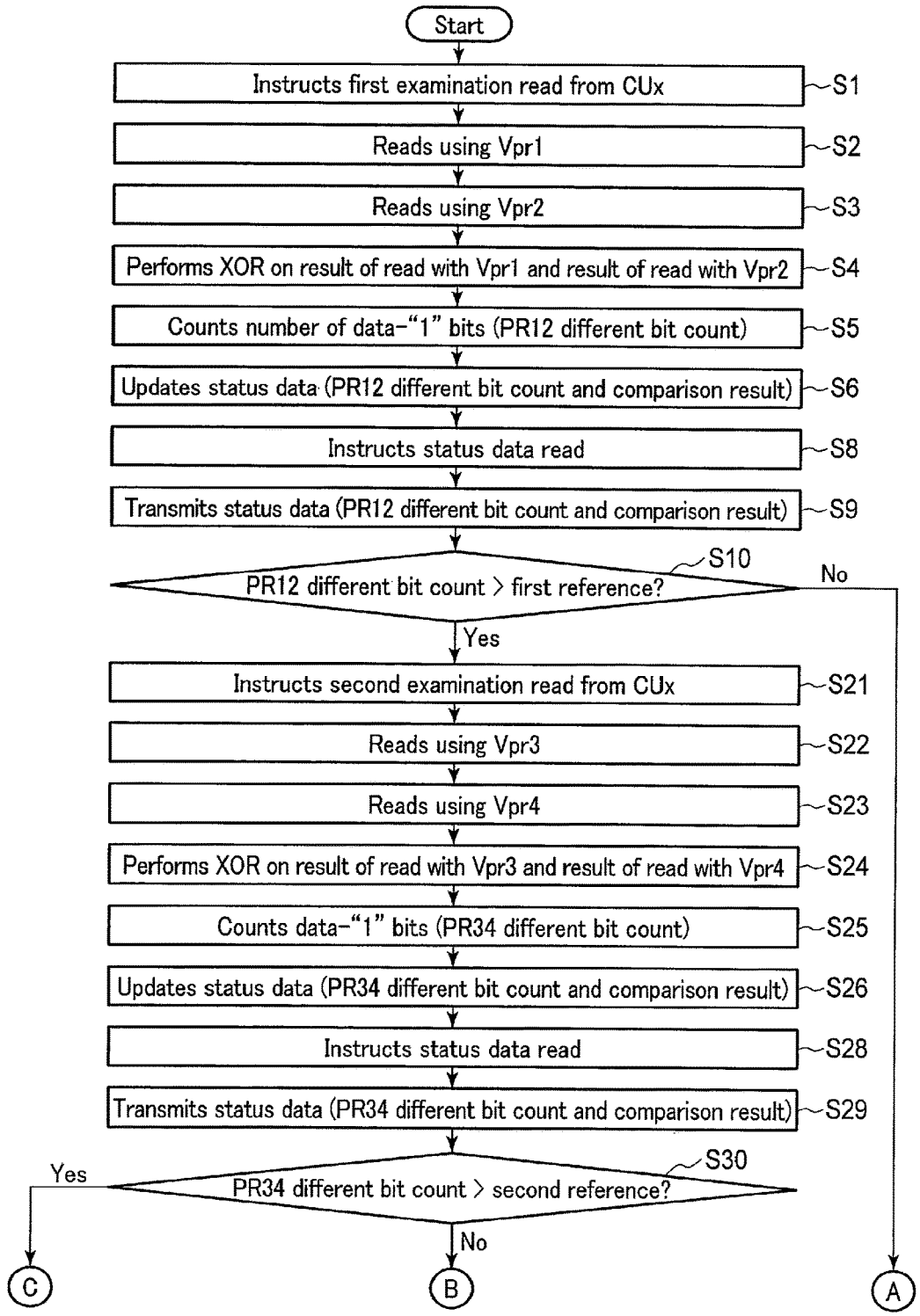
FIG. 11 illustrates an operation flow of the memory system of the first embodiment.
Figure 12:
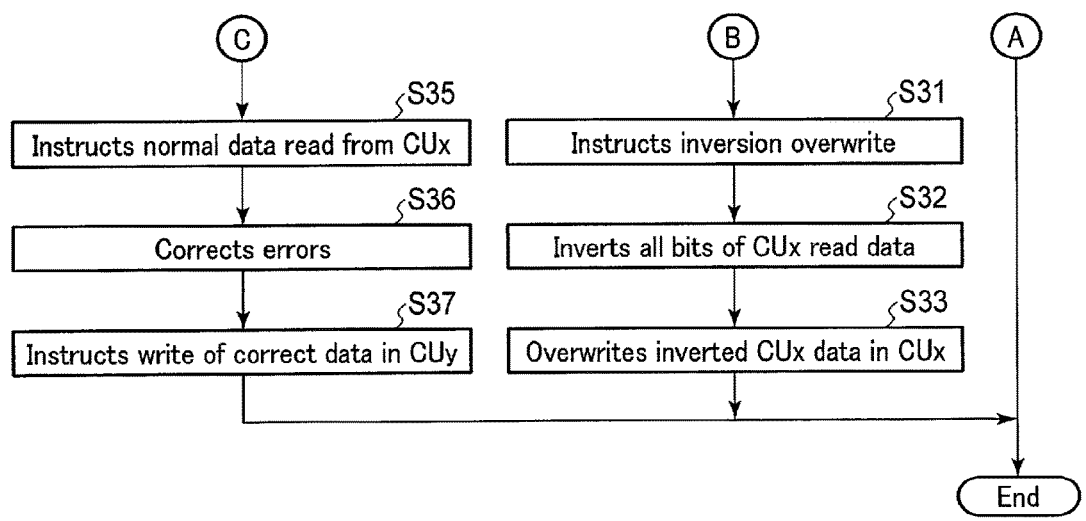
FIG. 12 illustrates a flow following the flow illustrated in FIG. 11.

FIGS. 11 and 12 illustrate a flow of an operation of the memory system of the first embodiment. The memory controller 2 performs the flow of FIGS. 11 and 12 to examine data in the memory device 1, and performs processes for improving read accuracy based on the states, for example, autonomously without an instruction of the host device 200 or in response to an instruction of the host device 200. The memory controller 2 performs the flow of FIGS. 11 and 12, for example during a period which includes no instructions from the host device 200. FIGS. 11 and 12 illustrate data examination and processes for improving read accuracy for a particular selected cell set CUx.

As illustrated in FIGS. 11 and 12, the memory controller 2 instructs the memory device 1 to perform a first examination read for a selected cell set CUx (step S1). Upon reception of the instruction, the memory device 1 performs steps S2 to S6. The memory device 1 transmits a busy signal to the memory controller 2 while performing steps S2 to S6.

In step S2, the memory device 1 reads data from the selected cell set CUx using the read voltage Vpr1, that is to say, the memory device 1 performs PR1. Specifically, the sequencer 12 controls the WL decoder 13, the SGL decoder 14, and the GBL decoder 15 to couple the selected cell set CUx to the global bit lines (selected global bit lines) GBL via the bit lines BL respectively coupled to the selected cell set CUx and the corresponding transistors ST and apply the voltage Vpr1 between the word line WL (selected word line WL) coupled to the selected cell set CUx and the global bit line GBL. The sequencer 12 then controls the sense amplifier 16 to determine whether each memory cell MC of the selected cell set CUx stores data "0" or data "1" based on the current flowing on the corresponding global bit line GBL. The result of the determination for each memory cell MC is stored in one corresponding data latch circuit DLC of a particular data latch (for example, data latch 17a). Thus, the data latch 17a stores one-page size data (Vpr1 read data) read from the selected cell set CUx using the read voltage Vpr1. The Vpr1 read data has in each bit data "0" or data "1" determined that the corresponding memory cell MC stores.

In step S3, the memory device 1 reads data from the selected cell set CUx using the read voltage Vpr2 as in step S2, that is, the memory cell device 1 performs PR2. The read one-page size data (Vpr2 read data) is stored in another data latch (for example, data latch 17b). The. Vpr2 read data has in each bit data "0" or data "1" determined that the corresponding memory cell MC stores. Step S3 may precede step S2.

In step S4, the sequencer 12 performs the exclusive OR (XOR) operation on the Vpr1 read data and the Vpr2 read data. Specifically, the sequencer 12 uses two bits at the same positions in the Vpr1 read data and the Vpr2 read data as inputs, performs the XOR operation on the two inputs with the logical operation circuit LC, and performs such an operation on all pairs of the bits of the Vpr1 read data and the Vpr2 read data. The result of the operation is stored in still another data latch (for example, data latch 17c). Specifically, the sequencer 12 performs the XOR operation on the data in a particular data latch circuit DLCa and the data in the data latch circuit DLCb coupled to that data latch circuit DLCa using the logical circuit LC coupled to those data latch circuits DLCa and DLCb. The result of the operation is stored in the data latch circuit DLCc coupled to the data latch circuits DLCa and DLCb storing the data for the inputs of the logical operation. Thus, the data latch 17c stores data including the result (PR12XOR data) of the XOR operation on the Vpr1 read data and the Vpr2 read data. The PR12XOR data has data "0" or data "1" in each bit. Data "1" indicates that the Vpr1 read data and the Vpr2 read data have different data in the corresponding bits.

In step S5, the count and determination circuit 12b counts the number of data-"1" bits in the PR12XOR data (PR12 different bit count) C1. In step S6, the sequencer 12 stores the PR12 different bit count C1 in a particular area of the register 12a. Moreover, the sequencer 12 compares the PR12 different bit count C1 with a first reference value, and stores a value based on the result of the comparison (PR12 comparison result) CR1 in another area of the register 12a. The first reference value may be zero, for example. The PR12 comparison result CR1 is data "0" when the PR12 different bit count C1 is smaller than or equal to the first reference value, and data "1" when the PR12 different bit count C1 exceeds the first reference value. The sequencer 12 transmits a ready signal to the memory controller 2 with the completion of step S6. The memory controller 2 learns the completion of step S6 by receiving the ready signal.

Learning the completion of step S6, the memory controller 2 instructs the memory device 1 to read status data (step S8). Upon reception of the instruction, the sequencer 12 transmits the status data to the memory controller 2 (step S9). The status data includes the count in the register 12a, i.e., the PR12 different bit count C1, and the PR12 comparison result CR1.

In step S10, the memory controller 2 refers to the PR12 comparison result CR1 and determines whether the PR12 different bit count C1 exceeds the first reference value. When the PR12 different bit count C1 does not exceed the first reference value, i.e., when the PR12 comparison result CR1 is data "0" (branch of "No"), the flow ends. On the other hand, when the PR12 different bit count C1 exceeds the first reference value, i.e., when the PR12 comparison result CR1 is data "1" (branch of "Yes"), the flow proceeds to step S21.

In step S21, the memory controller 2 instructs the memory device 1 to perform a second examination read for the selected cell set CUx. Upon reception of the instruction, the memory device 1 performs steps S22 to S26. The memory device 1 transmits the busy signal to the memory controller 2, while performing steps S22 to S26. Steps S22 to S26 are similar to steps S2 to S6, respectively. Significant differences include use of the read voltages Vpr3 and Vpr4 instead of the read voltages Vpr1 and Vpr2, and associated aspects. In other respects, steps S22 to S26 are like steps S2 to S6, respectively. Steps S22 to S26 are briefly described below.

In step S22, the memory device 1 reads data from the selected cell set CUx using the read voltage Vpr3, that is, the memory device 1 performs PR3. The read one-page size data (Vpr3 read data) is stored in a particular data latch (for example, data latch 17a). The Vpr3 read data has in each bit data "0" or data "1" determined that the corresponding memory cell MC stores.

In step S23, the memory device 1 reads data from the selected cell set CUx using the read voltage Vpr4, that is, the memory device 1 performs PR4. The read one-page size data (Vpr4 read data) is stored in another data latch (for example, data latch 17b). The Vpr4 read data has in each bit data "0" or data "1" determined that the corresponding memory cell MC stores. Step S23 may precede step S22.

In step S24, the sequencer 12 performs the XOR operation on the Vpr3 read data and the Vpr4 read data. Data including the result (PR34 XOR data) of the XOR operation is stored in still another data latch (for example, data latch 17c). The PR34 OR data has data "0" or data "1" in each bit. Data "1" indicates that the Vpr3 read data and the Vpr4 read data have different data in the corresponding bits.

In step S26, the sequencer 12 stores the count (PR34 different bit count) of data-"1" bits in the PR34 XOR data C2 in another area of the register 12a. Moreover, the sequencer 12 compares the PR34 different bit count C2 with a second reference value, and stores a value based on the result (PR34 comparison result) of the comparison CR2 in another area of the register 12a. The second reference value may be zero, for example. The PR34 comparison result CR2 is data "0" when the PR34 different bit count C2 is smaller than or equal to the second reference value, and data "1" when the PR34 different bit count C2 exceeds the second reference value.

In step S28, the memory controller 2 instructs the memory device 1 to read status data. In step S29, the sequencer 12 transmits the status data to the memory controller 2. The status data includes the count in the register 12a, i.e., the PR34 different bit count C2, and the PR34 comparison result CR2.

In step S30, the memory controller 2 refers to the PR34 comparison result CR2 and determines whether the PR34 different bit count C2 exceeds the second reference value. If the PR34 different bit count C2 does not exceeds the second reference value (branch of "No"), the flow proceeds to step S31.

In step S31, the memory controller 2 instructs an inversion overwrite for the selected cell set CUx. Upon reception of the instruction, the memory device 1 performs steps S32 and S33. In step S32, the sequencer 12 reads data in the selected cell set CUx using the normal read voltage Vm, and stores the read data (CUx read data) in a particular data latch (for example, data latch 17a). The sequencer 12 generates data (inverted CUx data) which include data inverted in all the bits of CUx read data, for example, using the logical circuits LC. The inverted CUx data has data inverted from the CUx read data also in the inversion flag bits. The inversion flag bits with data inverted from those at the time of being written indicate that the inverted CUx data has in each bit the data inverted from the data at the time of being written. The inverted CUx data is stored in another data latch (for example, data latch 17c). In the following description, data including inversion flag bits indicative of no data inversion may be referred to as original data.

In step S33, the sequencer 12 overwrites the inverted CUx data in the selected cell set CUx. As a result, the selected cell set CUx now stores in all the bits data inverted from the data which the selected cell set CUx stored at time of the start of step S33. With the completion of step S33, the flow ends.

When the PR34 different bit count C2 exceeds the second reference in step S30 (branch of "Yes"), the flow proceeds to step S35. In step S35, the memory controller 2 instructs the memory device 1 to read data from the selected cell set CUx. Upon reception of the instruction, the sequencer 12 performs the normal data read and obtain the CUx read data on the selected cell set CUx, and transmits the obtained CUx read data to the memory controller 2. Upon reception of the CUx read data, the memory controller 2 corrects, if any, errors in the CUx read data using the ECC circuit 24.

In step S37, the memory controller 2 instructs the memory device 1 to write the error-corrected (correct) CUx read data in the cell set CUy (y≠x). With the completion of step S37, the flow ends.

The flow shown in FIG. 11 is merely an example and only one of the set of steps S1 to S6 and the set of steps S21 to S26 may also be performed.

FIGS. 13 to 16 illustrate a part of the operation of the memory system 100 of the first embodiment, and illustrate examples of the signals DQ and data in some places at various times in the data examination.

FIG. 13 illustrates a case where the resistance value distributions of the memory cells MC of the selected cell set CUx have the shapes of the dashed lines of FIG. 9, and illustrates a case where the determination in step S10 of FIG. 11 results in "No". As illustrated in FIG. 13, the memory controller 2 transmits a command X1h, a command 00h, an address signal ADD, and a command 3Xh to the memory device 1 in order to instruct the first examination read in step S1 of FIG. 11. The address signal ADD identifies the selected cell set CUx. Upon reception of the command 3Xh, the sequencer 12 performs the PR1 for the selected cell set CUx, and stores the Vpr1 read data in the data latch 17a. The sequencer 12 then performs the PR2 for the selected cell set CUx, and stores the Vpr2 read data in the data latch 17b. In the FIG. 13 case, the Vpr1 read data are identical to the Vpr2 read data.

The sequencer 12 stores the PR12XOR data in the data latch 17c. The PR12XOR data has data "0" in all bits. The count and determination circuit 12b obtains the PR12 different bit count C1 and the comparison result CR1.

The sequencer 12 outputs the busy signal over a time tPR during the PR1, PR2 and XOR operations, and the count and determination.

The memory controller 2 transmits a command 70h to the memory device 1 to instruct a status read. Upon reception of the command 70h, the sequencer 12 transmits the status data (Data) for the last instruction, i.e., the first examination read in the ongoing example, to the memory controller 2. Such status data includes the PR12 different bit count C1 in its zero-th to second bits, and the PR34 different bit count C2 in its fourth to sixth bits, for example. Its third bit indicates the PR12 comparison result CR1, and its seventh bit indicates the PR3 comparison result CR2.

In this example, the PR12 different bit count C1 is equal to or smaller than the first reference value. For this reason, the data examination and the processes for data reading accuracy improvement for the selected cell set CUx in the case of FIG. 13 ends here.

Figure 14:
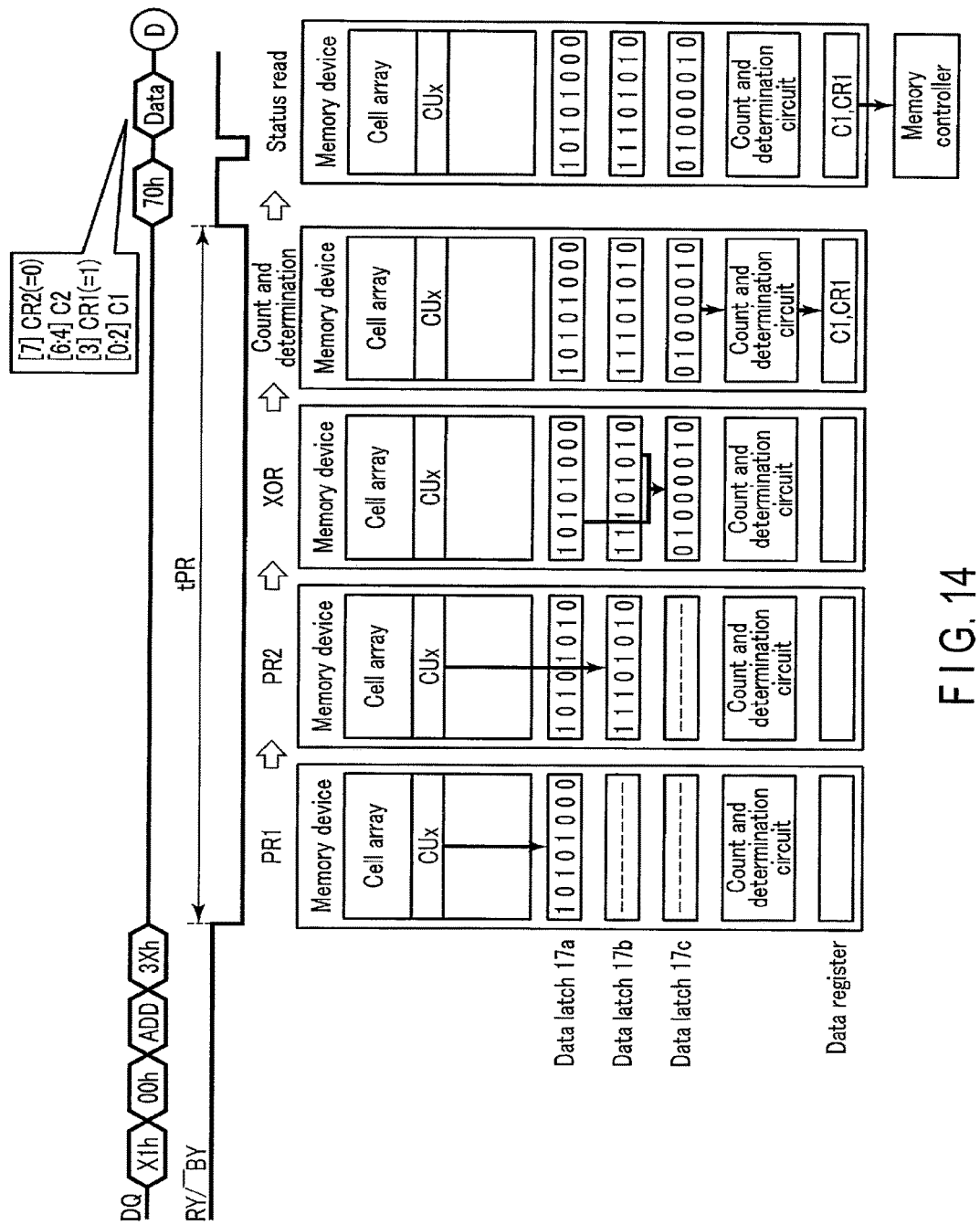
FIG. 14 illustrates a second example of the signals DQ and data in some places in the data examinations in the first embodiment.

FIGS. 14 and 15 illustrate a case of the resistance value distributions of the memory cells MC of the selected cell set CUx having the shapes of the solid lines of FIG. 9, and illustrate a case of the determination in step S30 of FIG. 11 being "No." As illustrated in FIGS. 14 and 15, the sequencer 12 stores the Vpr1 read data in the data latch 17a, and stores the Vpr2 read data in the data latch 17b as in FIG. 13. In the case shown in FIGS. 14 and 15, the Vpr1 read data is different from the Vpr2 read data.

The sequencer 12 stores the PR12XOR data in the data latch 17c. The PR12XOR data has data "1" in some bits. The count and determination circuit 12b obtains the PR12 different bit count C1 and the comparison result CR1. The sequencer 12 receives the command 70h and outputs the status data. The PR12 different bit count C2 in the status data Data exceeds the first reference value, and the comparison result CR1 is data "1." For this reason, the memory controller 2 transmits a command X2h, a command 00h, an address signal ADD, and a command 3Xh to the memory device 1 in order to instruct the second examination read in step S21 of FIG. 11. The address signal ADD identifies the selected cell set CUx. Upon reception of the command 3Xh, the sequencer 12 performs the PR3 for the selected cell set CUx, and stores the Vpr3 read data in the data latch 17a. The sequencer 12 then performs the PR4 for the selected cell set CUx, and stores the Vpr4 read data in the data latch 17b. In the cases shown in FIGS. 14 and 15, the Vpr3 read data are identical to the Vpr4 read data.

The sequencer 12 stores the PR34XOR data in the data latch 17c. The PR34XOR data has data "0" in all bits. The count and determination circuit 12b obtains the PR34 different bit count C2 and the comparison result CR2. The sequencer 12 receives a command 70h and outputs the status data. The PR34 different bit count C2 in the status data Data is equal to or smaller than the second reference value, and the comparison result CR2 is data "0". For this reason, the data examination of the selected cell set CUx and the processes for improvement of data read accuracy in the case shown in FIGS. 14 and 15 proceed to a write of the inverted CUx data in the selected cell set CUx.

FIG. 16 illustrates a case where the resistance value distributions of the memory cell MC of the selected cell set CUx have the shapes of the alternate long and short dash lines of FIG. 9, illustrates a case of the determination in step S30 of FIG. 11 being "Yes", and follows FIG. 14. The PR12 different bit count C1 in the status data Data in FIG. 14 exceeds the first reference value, and therefore the memory controller 2 instructs the second examination read to the memory device 1, and the sequencer 12 performs the PR3 and PR4 for the selected cell set CUx as in FIG. 15. In the case shown in FIG. 16, the Vpr3 read data in the data latch 17a are different from the Vpr4 read data in data latch 17b.

The sequencer 12 stores the PR34XOR data in the data latch 17c. The PR34XOR data has data "1" in some bits. The count and determination circuit 12b obtains the PR34 different bit count C2 and the comparison result CR2. The sequencer 12 receives a command 70h and outputs the status data. The PR34 different bit count in the status data Data exceeds the second reference value and the comparison result CR2 is data "1." For this reason, the data examination and the processes for, improvement of data read accuracy for the selected cell set CUx in the FIG. 16 case proceeds to a write of corrected CUx read data in the cell set CUy.

Figure 17:
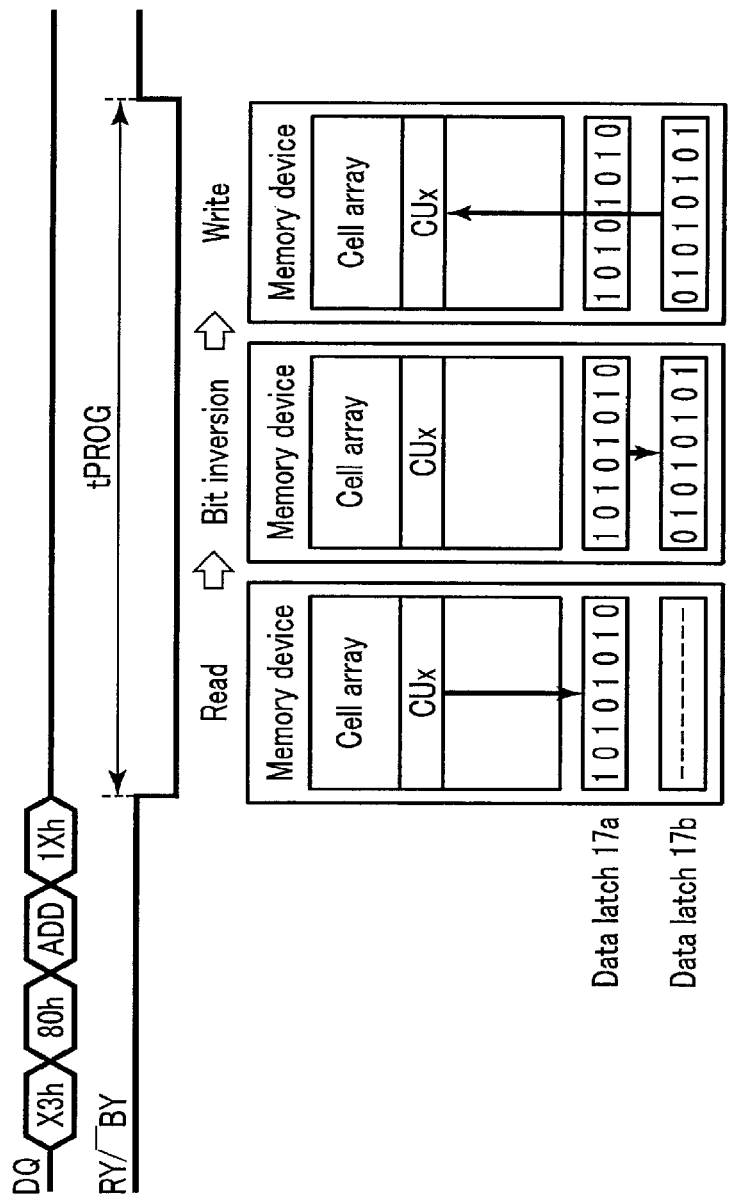
FIG. 17 illustrates an example of the signals DQ and data in some places at various times in a data read accuracy improvement processes in the first embodiment.

FIG. 17 illustrates a part of the operations of the memory system 100 of the first embodiment, and illustrates an example of the signals DQ and data in some places at various times in the processes for data read accuracy improvement. The FIG. 17 operation may follow FIG. 15.

As illustrated in FIG. 17, the memory controller 2 transmits a command X3h, a command 80h, an address signal ADD, and a command 1Xh to the memory device 1 in order to instruct the inversion overwrite in step S31 of FIG. 12. The address signal ADD identifies the selected cell set CUx. Upon reception of the command 1Xh, the sequencer 12 performs the normal data read for the selected cell set CUx, and stores the CUx read data in the data latch 17a. The sequencer 12 generates an inverted CUx data and stores the same in the data latch 17b. The sequencer 12 then writes the inverted CUx data in the selected cell set CUx.

The description so far is related to an example where the examination of data and the processes for the improvement of read accuracy (in particular, the inversion overwrite) are performed for the whole selected cell set CUx. The first embodiment is not limited to this example, and the examination of data and the processes for the improvement of read accuracy may be performed to at least one selected memory cell MCz. Specifically, in the examination, the memory controller 2 obtains data (Vpr1 cell read data) read from the selected memory cell MCz using the read voltage Vpr1, and obtains data (Vpr2 cell read data) read from the selected memory cell MCz using the read voltage Vpr2. The memory controller 2 then compares the Vpr1 cell read data with the Vpr2 cell read data. When the Vpr1 cell read data differs from the Vpr2 cell read data, it is determined that the selected memory cell MCz has a small difference in a resistance value compared to the resistance value that the selected memory cell MCz had immediately after the write.

Similarly, in the examination, the memory controller 2 obtains data (Vpr3 cell read data) read from the selected memory cell MCz using the read voltage Vpr3, and obtains data (Vpr4 cell read data) read from the selected memory cell MCz using the read voltage Vpr4. The memory controller 2 then compares the Vpr3 cell read data with the Vpr4 cell read data. When the Vpr3 cell read data differs from the Vpr4 cell read data, it is determined that the selected memory cell MCz has a moderate difference in a resistance value compared to the resistance value that the selected memory cell MCz had immediately after the write".

<1-3. Advantages>

A memory cell MC immediately after data has been written in has a desirable or almost-desirable high or low resistance state. The resistance state of the memory cell MC may, however, change after data has been written in. When a resistance value of a memory cell MC that is set to one of the resistance value states and thereby stores a corresponding data changes to a value which may be determined to be in another resistance state upon a data read, it results in an erroneous data read from that memory cell MC.

With only a small number of memory cells MC which have come to be determined to store erroneous data, corrected data are restored by the error correction. In general, however, the error correction requires time. Moreover, the error correction may become ineffective due to an increase of the number of memory cells MC which have come to be determined to store erroneous data. Furthermore, even a one-bit error may be unaccepted in the read data of one cell set CU as in the examples for this embodiment.

The memory controller 2 of the first embodiment examines the data in a memory cell MC while it needs no access to the memory device 1. In the examination, the memory controller 2 compares the Vpr1 cell read data and the Vpr2 cell read data from the selected memory cell MCz. When the selected memory cell MCz has a resistance value not that different from the resistance value that the selected memory cell MCz had immediately after the write, the Vpr1 cell read data and the Vpr2 cell read data should match. Relying on this assumption, by the detection of a memory cell MC which results in unmatched data, a memory cell MC that has a resistance value slightly different from the resistance value that the memory cell MC had immediately after the write is detected.

The memory controller 2 of the first embodiment compares the Vpr3 cell read data and the Vpr4 cell read data from the selected memory cell MCz. When the Vpr3 cell read data and the Vpr4 cell read data are different, this indicates that the selected memory cell MCz has a resistance value more largely different from the resistance value that the selected memory cell MCz had immediately after the write. Relying on this result, a memory cell MC with a resistance value moderately different from the resistance value that the selected memory cell MCz had immediately after the write is detected.

The memory controller 2 of the first embodiment compares the Vpr1 read data and Vpr2 read data from the selected cell set CUx, counts the number of bits having different data between the Vpr1 read data and the Vpr2 read data, and compares the PR12 different bit count C1 with the first reference value. With the PR12 different bit count C1 exceeding the first reference value, it is determined that the reliability of the data in the memory cells MC of the selected cell set CUx has deteriorated. Thus, a selected cell set CUx of deteriorated data reliability is detected. Detection of a selected cell set CUx with deteriorated data reliability allows processes of recovering the data reliability of such a cell set CUx to be performed.

The memory controller 2 of the first embodiment further compares the Vpr3 read data and the Vpr4 read data from the selected cell set CUx when the PR12 different bit count C1 exceeds the first reference value. The memory controller 2 then counts the number of bits having different data between the Vpr3 read data and the Vpr4 read data, and compares the PR34 different bit count C2 with the second reference value. With the PR34 different bit count C2 exceeding the second reference value, it is determined that the reliability of the data of the memory cells MC of the selected cell set CUx has moderately deteriorated. Thus, a selected cell set CUx with moderately deteriorated data reliability is detected. The selected cell set CUx with moderately deteriorated data reliability highly likely requires support by error correction in experiencing a data read in the near future. By detection of the selected cell set CUx with deteriorated data reliability so greatly that it should be supported by error correction in a data read in the near future, processes of recovering the data reliability to be performed in advance in preparation for an actual data read.

In general, inefficiencies due to a change in a resistance value of a memory cell, such as erroneous data reads, may be coped with by writing data stored in the memory cell over the same memory cell. A particular kind of memory cell, however, does not accept such overwrite. For example, a memory cell in which writing data may transition its resistance value state to both of two resistance states, such as the memory cell MC, may not accept overwrite. One of the reasons for this is considered as follows.

As described above, a memory cell MC has its resistance value increased by a current flowing through the memory cell MC. In a memory cell MC having a resistance value decreased from a high resistance value but still being a significantly high resistance value, it is not easy to let a current flow largely enough to further increase the resistance value of that memory cell MC. This makes it difficult to increase a resistance value of a memory cell MC which has a decreased resistance value but is still in the high resistance state.

In contrast, a memory cell MC has its resistance decreased by application of a voltage. The voltage applied is predetermined based on a magnitude required to bring a memory cell MC in the high resistance state into the low resistance state in the normal data write. Application of such a voltage to a memory cell MC that has a voltage increased from the low resistance value state but still being a low resistance value may destroy the memory cell MC. This makes it not easy to decrease a resistance value of a memory cell MC which has an increased resistance value but is still in the low resistance state.

The memory controller 2 instructs the memory device 1 to generate the inverted CUx data for the selected cell set CUx determined to have decreased reliability of data and write the inverted CUx data in the selected cell set CUx. Although this write results in inverted data being stored in each memory cell MC in the selected cell set CUx, a resistance value of each memory cell MC is reinstated as the resistance value immediately after data was written in. This resets the deterioration of the memory cells MC and recovers the reliability of the data stored in the memory cells MC. Moreover, a write of the inverted CUx data in the selected cell set CUx may overcome the difficulty of adjusting the resistance values of only particular memory cells MC, and may recover the decreased data reliability of cell sets CU.

The memory controller 2 reads data from the selected memory cell MCz determined to have moderately decreased reliability of data, and writes corrected data having gone through the error correction in another memory cell MC. This may avoid the necessity for error correction in an actual data read due to a significantly decreased reliability of data.

Thus, the reliability of data of the selected cell set CUx is determined, and a write of the inverted CUx data or the error-corrected data is performed depending on the deterioration of the reliability. The high reliability of data in the memory device 1 is maintained by performing such determination of the data reliability and write of the inverted CUx data or the corrected data, periodically, for example, and for all cell sets CU, for example. Specifically, the memory controller 2 may have some degree of assurance that a cell set CU which has gone through the data reliability examination and data reliability recovery processes (flow of FIGS. 11 and 12) has high data reliability.

<1-4. Modification Examples>

Figure 18:
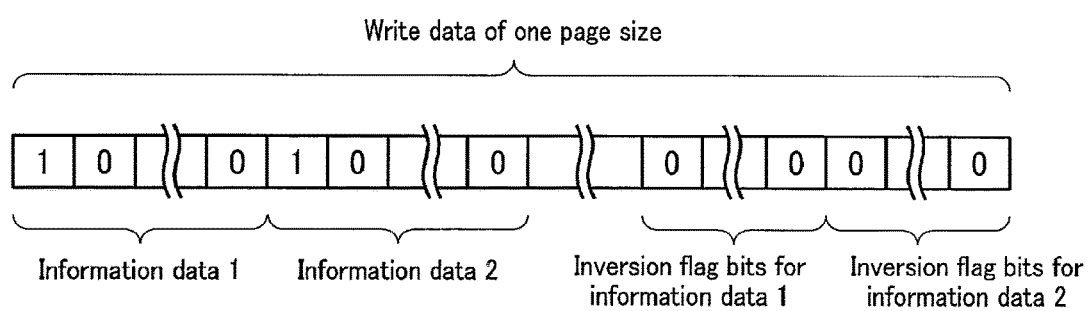
FIG. 18 illustrates details of data to be written-in a cell set in a memory system of a modified first embodiment.

FIG. 18 illustrates types of data included in data to be written in one cell set CU in this modification example. The memory controller 2 generates write data of one-page size in a form as illustrated in FIG. 18. As illustrated in FIG. 18, the write data includes plural units of information data. FIG. 18 illustrates an example presenting two information data units. According to use of an information data "1" and an information data 2, the write data includes inversion flag bits for the information data "1" and inversion flag bits for the information data 2. The inversion flag bits for the information data "1" serve the information data "1", and the inversion flag bits for the information data 2 serve the information data 2. Details of the inversion flag bits are as described with reference to FIG. 10.

Figure 19:
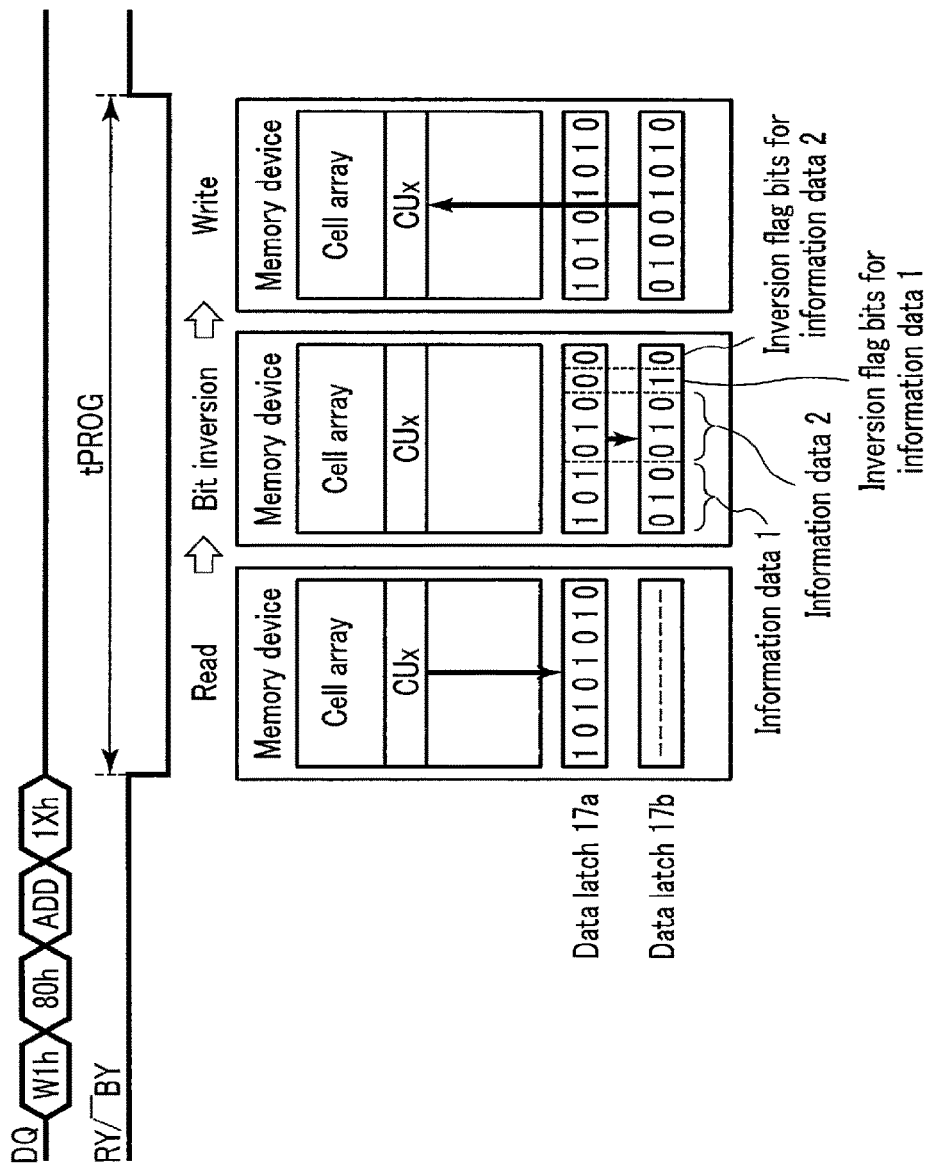
FIG. 19 illustrates an example of the signals DQ and data in some places at various times in a data read accuracy improvement processes in the modified first embodiment.

FIG. 19 illustrates a part of operations of the memory system 100 of a modification example, and illustrates an example of a signals DQ and data in some places at various times in processes for improvement of data read accuracy. The operations shown in FIG. 19 may follow those shown in FIG. 15.

As illustrated in FIG. 19, the memory controller 2 transmits a command W1h, a command 80h, an address signal ADD, and a command 1Xh to the memory device 1 in order to instruct the inversion overwrite in this modification example. The address signal ADD identifies a selected cell set CUx. The leading command W1h identifies in which information data values of bits are to be inverted. By way of example, the command W1h identifies the information data "1".

Upon reception of the command 1Xh, the sequencer 12 performs the normal data read for the selected cell set CUx, and stores the CUx read data in the data latch 17a. The sequencer 12 inverts all bits of the information data "1" and all bits of the inversion flag bits for the information data "1" in the CUx read data to generate a partially inverted CUx data. The sequencer 12 writes the partially inverted CUx data in the selected cell set CUx.

This modification example may ease stress which may be applied to the selected cell set CUx by the overwrite for data inversion in the memory cells MC.

(Second Embodiment)

The second embodiment differs from the first embodiment in components which generates the inverted CUx data.

The memory system 100 of the second embodiment has corresponding components and connections to those of the memory system 100 of the first embodiment. In contrast, however, the memory controller 2 of the second embodiment is configured to perform operations described in the following, and specifically the firmware in the ROM 22 is configured to cause the memory controller 2 to perform the operations described in the following.

Figure 20:
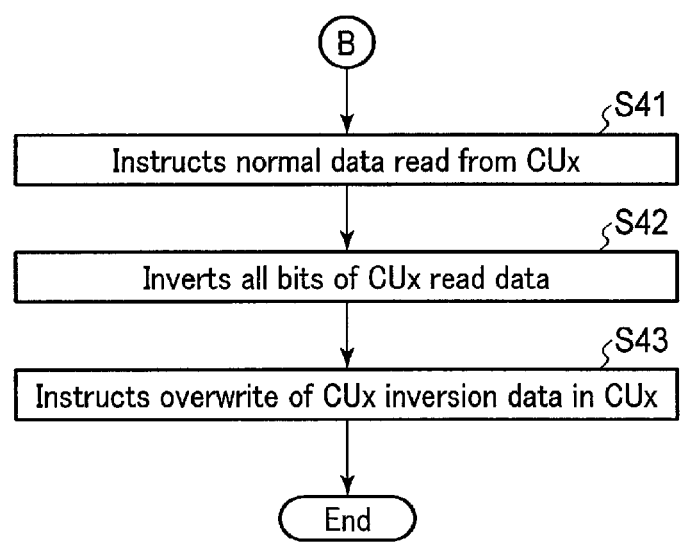
FIG. 20 illustrates a part of an operation flow of a memory system of a second embodiment.

FIG. 20 illustrates a part of the flow of operations of the memory system according to the second embodiment, and replaces a part of the flow shown in FIG. 12 of the first embodiment.

As illustrated in FIG. 20, in a case where the PR34 different bit count C2 not exceeding the second reference value in step S30 of FIG. 12 (branch of "No"), the flow proceeds to step S41. In step S41, the memory controller 2 obtains the CUx read data as in step S35. In step S42, the memory controller 2 generates the inverted CUx data as in step S32.

In step S43, the memory controller 2 instructs the memory device 1 to write the inverted CUx data in the selected cell set CUx. Upon reception of the instruction, the sequencer 12 overwrites the inverted CUx data in the selected cell set CUx.

Figure 21:
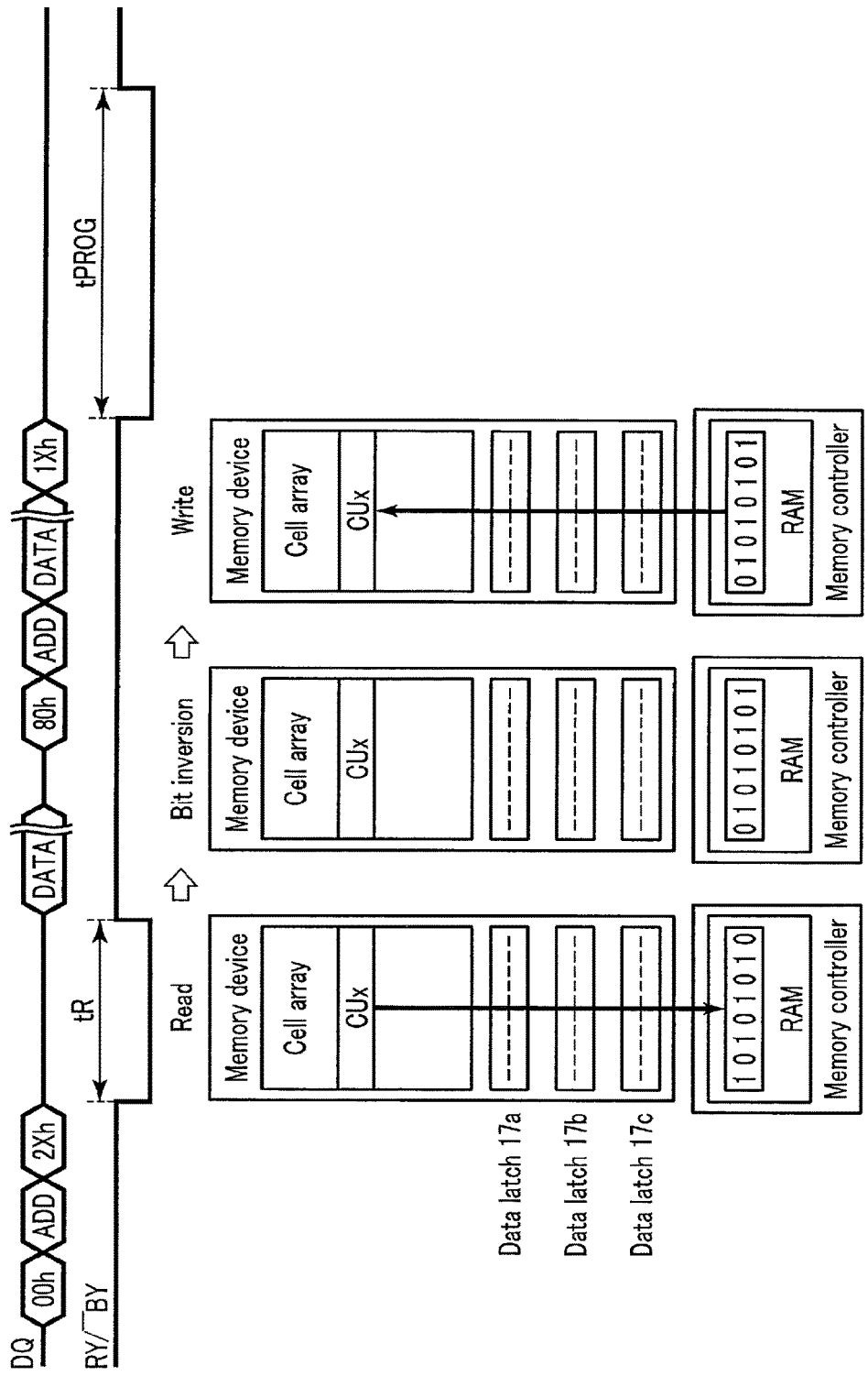
FIG. 21 illustrates an example of the signals DQ and data in some places at various times in a data read accuracy improvement processes in the second embodiment.

FIG. 21 illustrates a part of operations of the memory system 100 of the second embodiment, and illustrates an example of signals DQ and data in some places at various times in processes for improvement of data read accuracy. The operations shown in FIG. 21 may follow those shown in FIG. 15.

As illustrated in FIG. 21, the memory controller 2 transmits a command 00h, an address signal ADD, and a command 2Xh to the memory device 1 in order to instruct the data read in step S41. The address signal ADD identifies the selected cell set CUx. Upon reception of the command 2Xh, the sequencer 12 performs the normal data read for the selected cell set CUx, and transmits the CUx read data to the memory controller 2. The sequencer 12 outputs a busy signal over a time tR from the reception of the command 2Xh to the completion of preparation for transmitting the CUx read data.

Upon reception of the CUx read data, the memory controller 2 generates the inverted CUx data. The memory controller 2 then transmits a command 80h, an address signal ADD, and an inverted CUx data DATA and a command 1Xh to the memory device 1 in order to instruct the data overwrite in step S43. The address signal ADD identifies the selected cell set CUx. Upon reception of the command 1Xh, the sequencer 12 writes the inverted CUx data in the selected cell set CUx. The sequencer 12 outputs the busy signal over a time tPROG from the reception of the command 1Xh to the completion of the data write.

The second embodiment may also be combined with the modification examples of the first embodiment.

According to the second embodiment, like the first embodiment, the Vpr1 cell read data and the Vpr2 cell read data from the selected memory cell MCz are compared, and/or the Vpr3 cell read data and the Vpr4 cell read data from the selected memory cell MCz are compared. This may be advantageous as the first embodiment.

According to the second embodiment, like the first embodiment, the Vpr1 read data and the Vpr2 read data from the selected cell set CUx are compared, and/or the Vpr3 read data and the Vpr4 read data from the selected cell set CUx are compared. This may be advantageous as the first embodiment.

According to the second embodiment, like the first embodiment, for a memory cell MCz determined to have decreased data reliability, the inverted data of the data which the memory cell MCz has stored immediately after the data write is overwritten in the selected memory cell MCz as in the first embodiment. This may be advantageous as the first embodiment.

According to the second embodiment, the inverted CUx data is generated by the memory controller 2. This may require fewer functions to the memory device 1 for the memory system 100 to perform overwriting the inverted CUx data than the functions required to the memory device 1 of the first embodiment.

(Third Embodiment)

The third embodiment relates to a read of the inverted CUx data, and may be combined with the first or second embodiment.

The memory system 1 of the third embodiment has corresponding components and connections to those of the memory system 100 of the first embodiment. In contrast, however, the memory device 1 of the third embodiment, especially the sequencer 12, is configured to perform operations described in the following.

Figure 22:
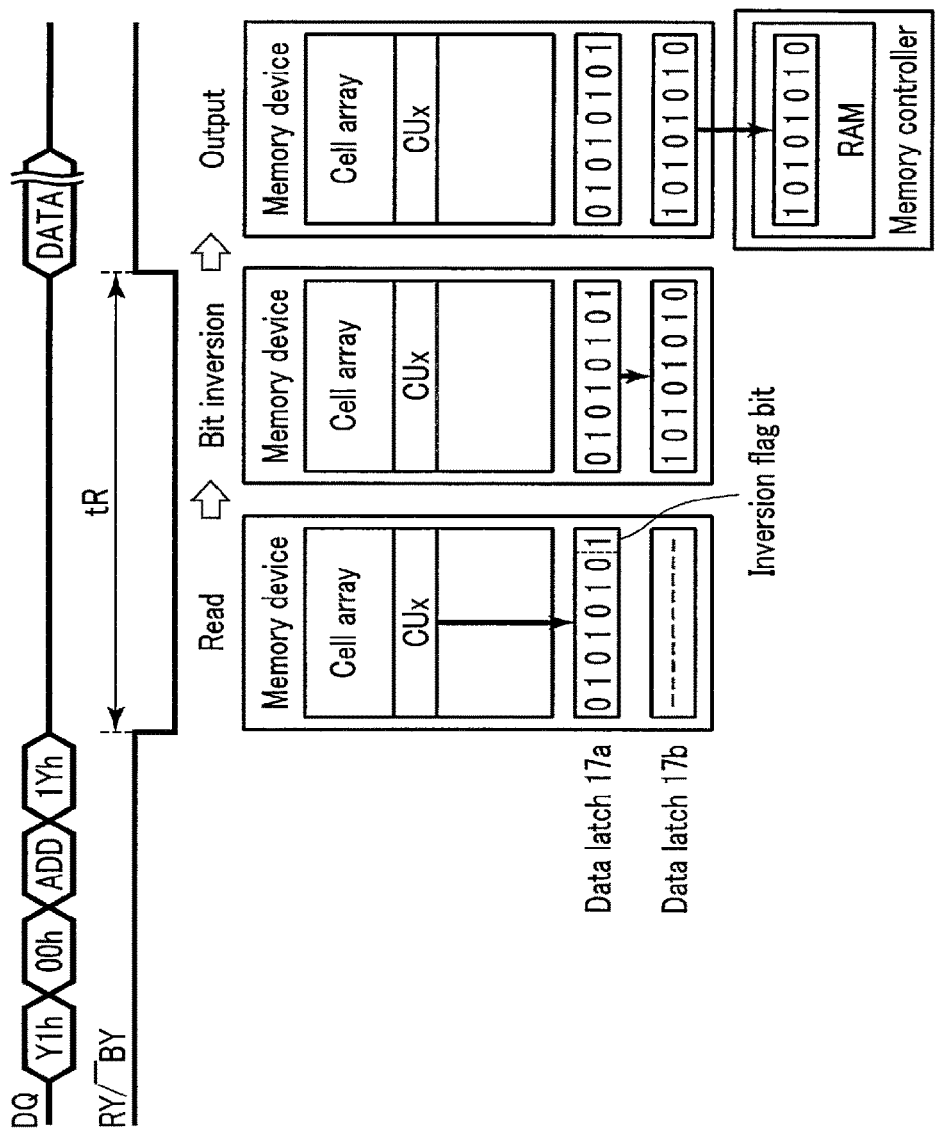
FIG. 22 illustrates an example of the signals DQ and data in some places in a data read in a third embodiment.

FIG. 22 illustrates an example of signals DQ and data in some places in a data read in the memory system 100 of the third embodiment. FIG. 22 and the following description are provided according to an example where a selected cell set CUx stores inverted CUx data.

As illustrated in FIG. 22, the memory controller 2 transmits a command Y1h, a command 00h, an address signal ADD, and a command 1Yh to the memory device 1 in turn to read data from the selected cell set CUx. The address signal ADD identifies a selected cell set CUx.

Upon reception of the command 1Yh, the sequencer 12 performs the normal data read for the selected cell set CUx. The sequencer 12 examines the inversion flag bits of the CUx read data. As described in the first embodiment, the inversion flag bits indicates whether the corresponding data (CUx read data including those inversion flag bits) includes data-inverted bits or not. If a rule provides that a particular value (for example, "0") be used to indicate that a normal write without data inversion is conducted, the sequencer 12 learns whether the inversion flag bit indicates the data inversion with reference to the data of the inversion flag bit. As this example, with the inversion flag bit being "0", the CUx read data is not inverted data, and with the inversion flag bit being "1", the CUx read data is inverted data.

As described above, in the ongoing example, the data in the selected cell set CUx is inverted data in which all bits have been inverted, and therefore the inversion flag bit indicates that the data is inverted data. For this reason, the sequencer 12 inverts data in all bits of the CUx read data, generates the original data (CUx original data), and transmits the CUx original data to the memory controller 2.

In contrast, when the inversion flag bits indicate that the data is not inverted data, the sequencer 12 transmits the CUx read data to the memory controller 2 as it is read.

Determination of the data inversion according to the inversion flag bit may be performed by any known method. For example, as described in the first embodiment, the inversion flag bit may be replaced by plural bits of the same data, and in the determination, the data stored in the majority bits are adopted as information that the inversion flag bits should indicate, such as information representing that data is inverted data.

According to the third embodiment, the data to be written in the selected cell set CUx includes the inversion flag bit (s), and the sequencer 12 determines whether the CUx read data is the inverted CUx data based on the inversion flag bit (s). When the CUx read data is an inverted CUx data, it outputs the CUx original data. This allows the memory device 1 to detect the inversion of bit data and transmit the restored CUx original data even if the selected cell set CUx includes the inverted CUx data. In addition, by setting the inversion flag bit (s) used in a write of the CUx original data in the selected cell set CUx to particular fixed data, the inversion flag bit (s) is (are) transformed into the values indicative of the data inversion in the inverted CUx data without passing through a special process. Therefore, the third embodiment may avoid complicated processes in reading data, when combined with the first or second embodiment.

Moreover, the memory controller 1 may rely on the memory device 1 regarding that the read data (CUx original data) received from the memory device 1 of the third embodiment has high reliability. Details are as follows. The CUx original data may or may not have gone through transformation into the inverted CUx data. No passing through the inverted CUx data indicates that the first examination read presented that the PR12 different bit count C1 was lower than or equal to the first reference value, and the CUx read data has high reliability. In contrast, passing though the inverted CUx data indicates that the first examination read presented that the PR12 different bit count C1 was lower than or equal to the first reference value, but the reliability of data has been recovered by the data inversion.

(Fourth Embodiment)

The fourth embodiment differs from the third embodiment in components to restore the CUx original data from the inverted CUx data.

The memory system 100 of the fourth embodiment has corresponding components and connections to those of the memory system 100 of the first embodiment. In contrast, however, the memory controller 2 of the fourth embodiment is configured to perform operations described in the following, and specifically the firmware in the ROM 22 is configured to cause the memory controller 2 to perform the operations described in the following.

FIG. 23 illustrates an example of signals DQ and data in some places in a data read in the memory system 100 of the fourth embodiment. FIG. 23 and the following description are according to this example where the selected cell set CUx stores the inverted CUx data.

As illustrated in FIG. 23, the memory controller 2 transmits a command 00h, an address signal ADD, and a command 2Xh to the memory device 1 in turn to read data from a selected cell set CUx. The address signal ADD identifies the selected cell set CUx.

Upon reception of the command 2Xh, the sequencer 12 performs the normal data read for the selected cell set CUx, and transmits the CUx read data to the memory controller 2. The memory controller 2 examines the inversion flag bit(s) of the CUx read data. When the inversion flag bit(s) indicate(s) the inversion of the data (when the CUx read data is the inverted CUx data), the memory controller 2 inverts the CUx read data in all bits and obtains the CUx original data.

According to the fourth embodiment, like the third embodiment, the data to be written in the selected cell set CUx includes the inversion flag bit (s), and the memory controller 2 determines whether the CUx read data is the inverted CUx data based on the inversion flag bit(s), and when the CUx read data is the inverted CUx data, it inverts the CUx read data in each bit to obtain a restored CUx original data. This may be advantageous as the third embodiment.

According to the fourth embodiment, the CUx original data is generated by the memory controller 2. This may require fewer functions to the memory device 1 for the memory controller 2 to obtain the CUx original data than the functions required to the memory device 1 of the third embodiment.

(Fifth Embodiment)

The fifth embodiment relates to the overwrite to a cell set CU.

The memory system 1 of the fifth embodiment has corresponding components and connections to those of the memory system 100 of the first embodiment. In contrast, however, the memory device 1 of the fifth embodiment, especially the sequencer 12, is configured to perform operations described in the following.

Figure 24:
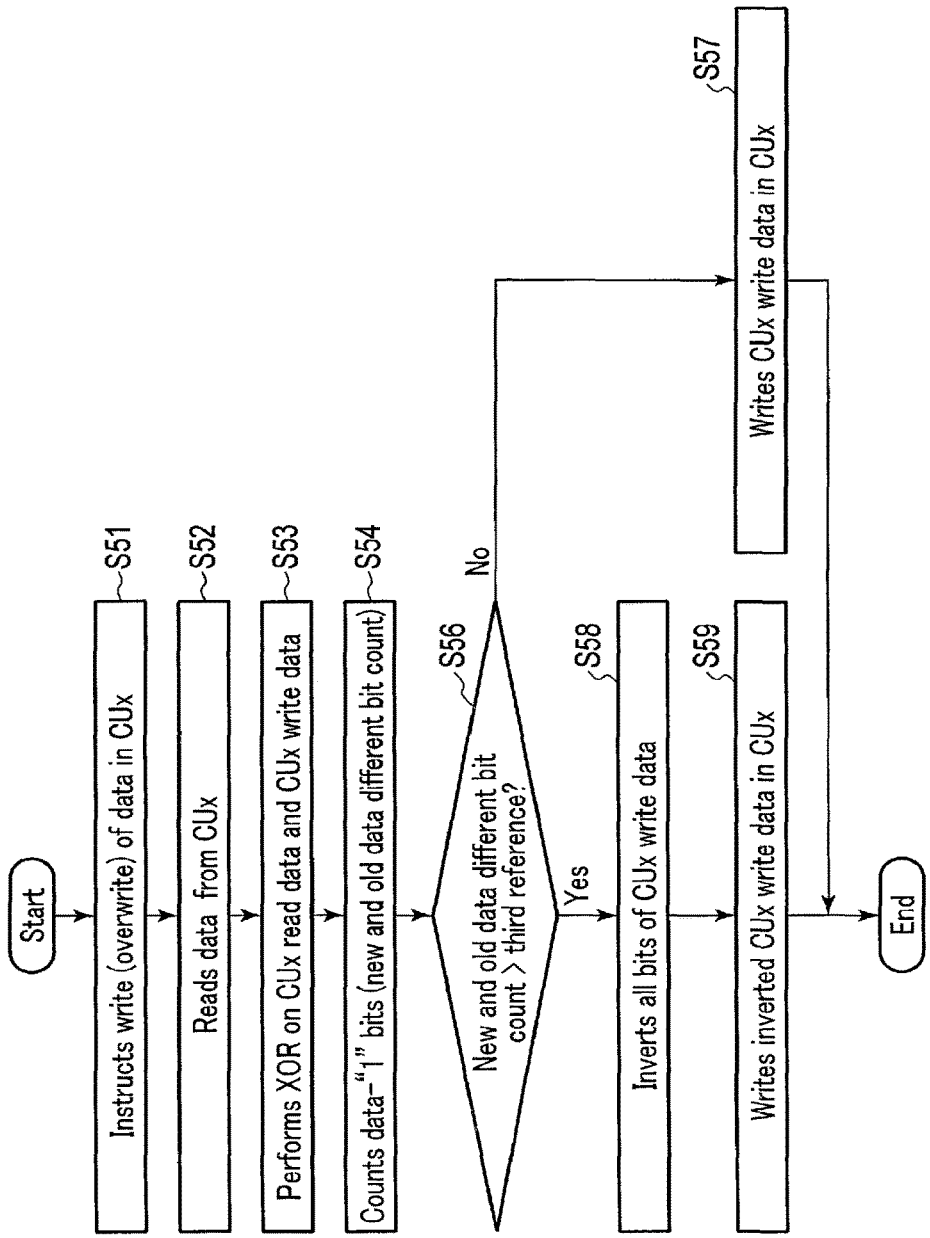
FIG. 24 illustrates an operation flow of a memory system of a fifth embodiment.

FIG. 24 illustrates the flow of operations of the memory system of the fifth embodiment. FIG. 24 and the following description are according to an example where the selected cell set CUx already has experienced the data write and stores data at the start of the flow shown in FIG. 24.

As illustrated in FIG. 24, the memory controller 2 instructs a write (an overwrite) of data (CUx write data) to be written in the selected cell set CUx (step S51). This data write instruction instructs a write different from the normal data write. The instructed data overwrite is hereinafter referred to as a conditional inversion write. The CUx write data is stored in one of the data latches 17 (for example, data latch 17c).

In step S52, the sequencer 12 receives the instruction and performs the normal data read for the selected cell set CUx. The obtained CUx read data is stored in one of the data latches 17 (for example, data latch 17a). In step S53, the sequencer 12 performs the XOR operation on the CUx read data and the CUx write data. Specifically, the sequencer 12 uses two bits at each of the same positions in the CUx read data and the CUx write data as the inputs, performs the XOR operation on the inputs of two bits with a logical operation circuit LC, and performs such an operation for all pairs of bits of the CUx read data and the CUx write data. The result of the operations (XOR data for old and new), has in each bit data "0" or data "1", and is stored in another data latch (for example, data latch 17b). Data "1" indicates that data that is opposite to the data currently stored in a corresponding cell transistor MC is to be written in the same cell transistor.

In step S54, the sequencer 12 counts the number of data-"1" bits in the XOR data for the new and old data (new and old data different bit count) C3. In step S56, the sequencer 12 determines whether the new and old data different bit count C3 exceeds a third reference value. The third reference is half the number of total bits of data for one page, for example. If the new and old data different bit count C3 is lower than or equal to the third reference value (branch of "No" at step S56), the sequencer 12 writes the CUx write data in the selected cell set CUx, and the flow ends.

In contrast, if the new and old data different bit count C3 exceeds the third reference value (branch of "Yes" at step S56), the sequencer 12 inverts the CUx write data in all bits of the data to generate an inverted CUx write data (step S58). In step S59, the sequencer 12 writes the inverted CUx write data in the selected cell set CUx, and the flow ends.

Figure 25:
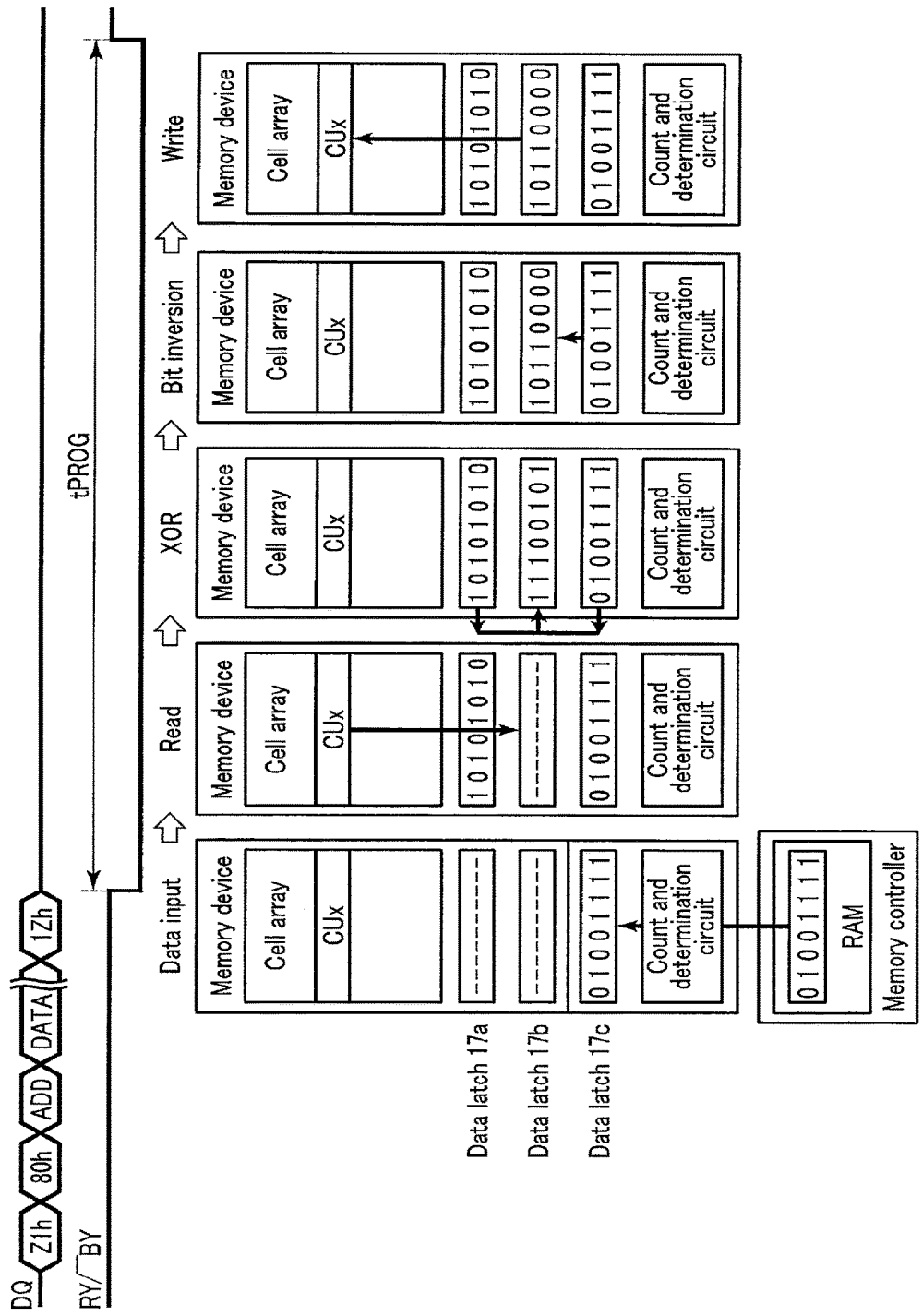
FIG. 25 illustrates an example of the signals DQ and data in some places in a conditional inversion write in the fifth embodiment.

FIG. 25 illustrates an example of signals DQ and data in some places in the conditional inversion write in the memory system 100 of the fifth embodiment. As illustrated in FIG. 25, the memory controller 2 transmits a command Z1h, a command 80h, an signal ADD, CUx write data DATA, and a command 1Zh to the memory device 1 in order to instruct the conditional inversion write in step 51 of FIG. 24. The address signal ADD identifies the selected cell set CUx. The CUx write data is stored in the data latch 17c.

Upon reception of the command 1Zh, the sequencer 12 performs the normal data read for the selected cell set CUx. The CUx read data is stored in the data latch 17a. The sequencer 12 performs the XOR operation on the CUx write data and the CUx read data. The XOR data for the new and old data is stored in the data latch 17b. The count and determination circuit 12b obtains the new and old data different bit count C3, and compares the new and old data different bit count C3 with the third reference value. If the new and old data different bit count C3 exceeds the third reference value, it means that the number of bits in which data opposite to the data currently stored will be overwritten exceeds the third reference value (for example, half-page size). In this case, the sequencer 12 writes the inverted CUx write data in the selected cell set CUx. As a result, the number of bits in which data opposite to the current data is overwritten is lower than or equal to the third reference value. This is because the overwrite occurs only in bits in which data opposite to the data currently stored is written, and data is not written in bits in which the currently stored data is maintained.

In contrast, when the new and old data different bit counts C3 indicates that the number of bits in which the opposite data will be written is lower than or equal to the third reference value, the number of bits in which the data currently stored will be maintained is larger than or equal to the third reference value (for example, half-page size). In this case, the sequencer 12 overwrites the CUx write data in the selected cell set CUx (not shown).

Thus, the number of bits in which data opposite to the data currently stored will be written is lower than or equal to the third reference value irrespective of the details of the CUx read data.

For a data read from the selected cell set CUx, the third or fourth embodiment may be applicable.

According to the fifth embodiment, when the memory device 1 is instructed to perform the conditional inversion write for the selected cell set CUx, it counts the number C3 of bits having different data between the CUx write data and the CUx read data. When the new and old data different bit count C3 is lower than or equal to the third reference value, the sequencer 12 writes the CUx write data in the selected cell set CUx, and when the new and old data different bit count C3 exceeds the third reference value, it writes the inverted CUx write data in the selected cell set CUx. Such a write maintains the number of the bits in which data opposite to the data currently stored will be written to be lower than or equal to the third reference value irrespective of the details of the CUx read data. This may suppress the number of writes to memory cells MC in a selected cell set CUx, and reduction of the life of the selected cell set CUx caused by the writes. This in turn may suppress reduction of the life of the memory device 1.

(Sixth Embodiment)

The sixth embodiment differs from the fifth embodiment in components to determine the necessity of and generate the inverted CUx write data.

The memory system 100 of the sixth embodiment has corresponding components and connections to those of the memory system 100 of the first embodiment. In contrast, however, the memory controller 2 of the sixth embodiment is configured to perform operations described in the following, and specifically the firmware in the ROM 22 is configured to cause the memory controller 2 to perform the operations described in the following.

FIG. 26 illustrates a part of the flow of operations of the memory system of the sixth embodiment. FIG. 26 and the following description are according to an example where a selected cell set CUx has already experienced a data write and stores data at the start of the flow shown the FIG. 26.

As illustrated in FIG. 26, in step S61, the memory controller 2 determines to write data in a selected cell set CUx, and generates CUx write data. In step S62, the memory controller 2 instructs the memory device 1 to read data from the selected cell set CUx, and obtains the CUx read data.

In step S63, the memory controller 2 performs the XOR operation on the CUx write data and the CUx read data as step S53. In step S64, the memory controller 2 counts the number of bits of data-"1" in the XOR data for the new and old data (new and old data different bit count) C3. In step S66, the memory controller 2 determines whether the new and old data different bit count C3 exceeds the third reference value. If the new and old data different bit count C3 is lower than or equal to the third reference value (branch of "No" at step S66), the memory controller 2 instructs the memory device 1 to write the CUx write data in the selected cell set CUx (step S71). Upon reception of the instruction, the sequencer 12 writes the CUx write data in the selected cell set CUx (step S72), and the flow ends.

In contrast, if the new and old data different bit count C3 exceeds the third reference value (branch of "Yes" at step S66), the memory controller 2 generates inverted CUx write data as in step S58 (step S73). In step S74, the memory controller 2 instructs the memory device 1 to write the inverted CUx write data in the selected cell set CUx. Upon reception of the instruction, the sequencer 12 writes the inverted CUx write data in the selected cell set CUx (step S75), and the flow ends.

Figure 27:
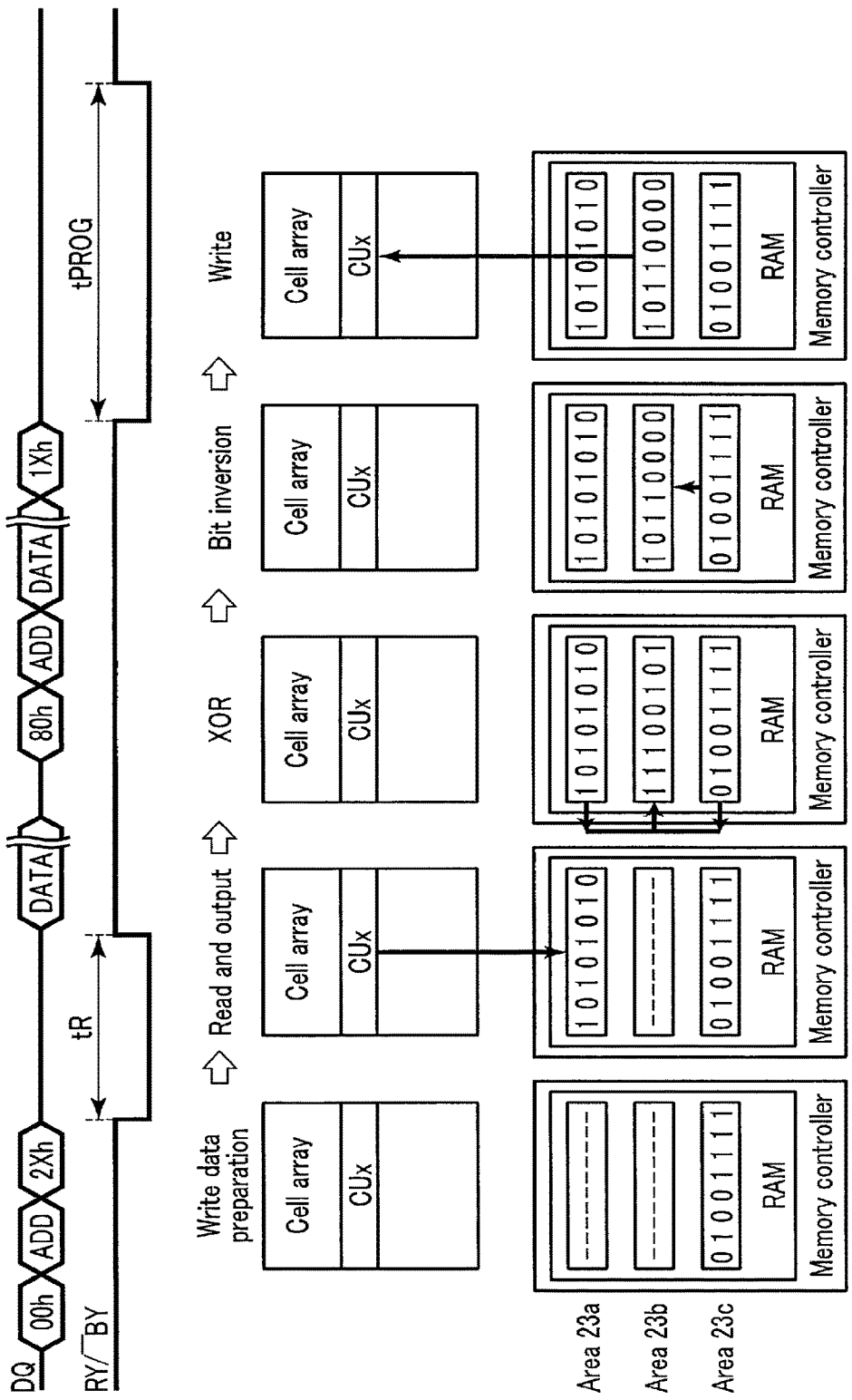
FIG. 27 illustrates an example of the signals DQ and data in some places in a conditional inversion write in the sixth embodiment.

FIG. 27 illustrates an example of signals DQ and data in some places in the conditional inversion write in the memory system 100 of the sixth embodiment. As illustrated in FIG. 27, the memory controller 2 generates the CUx write data in the RAM 23, for example in an area 23c in the RAM 23. The memory controller 2 transmits a command 00h, an address signal ADD, and a command 2Xh to the memory device 1 in order to instruct the data read from a selected cell set CUx in step S62 of FIG. 26. The address signal ADD identifies the selected cell set CUx. Upon reception of the command 2Xh, the sequencer 12 performs the normal data read for the selected cell set CUx, and transmits the CUx read data to the memory controller 2. The memory controller 2 receives the CUx read data, and stores the same in another area of the RAM 23 (for example, an area 23a).

The memory controller 2 performs the XOR operation on the CUx write data and the CUx read data. The XOR data for the new and old data is stored in another area of the RAM 23 (for example, an area 23b). The memory controller 2 obtains the new and old data different bit count C3, and compares the new and old data different bit count C3 with the third reference value. If the new and old data different bit count C3 exceeds the third reference value, the memory controller 2 generates an inverted CUx write data from the CUx write data in an area of the RAM 23 (for example, the area 23b).

The memory controller 2 transmits a command 80h, an address signal ADD, a CUx write inversion data DATA, and a command 1Xh to the memory device 1 in order to instruct the write of the inverted CUx write data in step S74 of FIG. 26. The address signal ADD identifies the selected cell set CUx. The sequencer 12 writes the inverted CUx write data in the selected cell set CUx.

In contrast, if the new and old data different bit count C3 is lower than or equal to the third reference value, the memory controller 2 transmits the CUx write data stored in the area 23c to the memory device 1.

For a data read from the selected cell set CUx, the third or fourth embodiment may be applicable.

According to the sixth embodiment, the memory controller 2 counts the number C3 of bits having different data between the CUx write data and the CUx read data upon determination of a write to the selected cell set CUx. The memory controller 2 then instructs the memory device 1 to write the CUx write data in the selected cell set CUx when the new and old data different bit count C3 is lower than or equal to the third reference value, and it instructs the memory device 1 to write the inverted CUx write data in the selected cell set CUx when the new and old data different bit count C3 exceeds the third reference value as in the fifth embodiment. This may be advantageous as the fifth embodiment.

According to the sixth embodiment, the counting for the new and old data different bit count C3 and the generation of the inverted CUx write data are performed by the memory controller 2. This requires fewer functions to the memory device 1 to allow for the memory system 100 to determine the necessity of and generate the inverted CUx write data than the functions required to the memory device 1 of the fifth embodiment.

The description so far relates to examples where the memory device 1 may be a ReRAM. The embodiments are not limited to such examples but may be applicable to other RAMs, such as magnetoresistive RAMs (MRAMs) and phase change RAMs (PCRAMs).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a memory device including a memory cell with a variable resistance value, and a first controller; and
a second controller configured to instruct the memory device to write data having a first value or a second value that is different from the first value,
wherein:
the first controller is configured to compare first read data read from the memory cell when a first voltage is applied to the memory cell with second read data read from the memory cell when a second voltage is applied to the memory cell,
the first voltage is different from the second voltage,
the first read data has the first value or the second value, and
the second read data has the first value or the second value.

2. The system according to claim 1, further comprising a second memory cell, and
wherein when the data read from the second memory cell has the first value and the data read from the memory cell has the first value, third read data indicating that data of the second value is stored in the memory cell is generated.

3. The system according to claim 2, wherein:
the first controller is configured to transmit the third read data to the second controller when instructed to read data from the memory cell.

4. The system according to claim 2, wherein:
the second controller is further configured to:
receive a data read from the memory cell,
receive a data read from the second memory cell, and
generate third read data indicating that data of the second value is stored in the memory cell when the data read from the second memory cell has the first value and the data read from the memory cell has the first value.

5. A memory system comprising:
a memory device including a memory cell with a variable resistance value, and a first controller configured to compare first read data read from the memory cell when a first voltage is applied to the memory cell with second read data read from the memory cell when a second voltage is applied to the memory cell; and
a second controller, wherein:
the first voltage is different from the second voltage,
the first read data has a first value or a second value that is different from the first value,
the second read data has the first value or the second value
whether the data read from the memory cell has the first value or the second value is determined,
when the data read from the memory cell has the first value, data of the second value is written in the memory cell,
the first controller is further configured to determine which of the first and second values the data read from the memory cell when the read voltage is applied to the memory cell has,
the first voltage is lower than the read voltage, and
the second voltage is higher than the read voltage.

6. The system according to claim 5, wherein:
the first controller is further configured to:
read data from the memory cell with the read voltage applied to the memory cell, and write data of the second value in the memory cell when the data read from the memory cell has the first value.

7. The system according to claim 5, wherein:
the second controller is configured to:
receive third read data which is read from the memory cell with the read voltage applied to the memory cell and has the first or second value, and
instruct the memory device to write data of the second value in the memory cell when the third read data has the first value.

8. The system according to claim 5, wherein:
the first controller is further configured to compare third read data with fourth read data, the third read data being read from the memory cell with a third voltage applied to the memory cell, the fourth read data being read from the memory cell with a fourth voltage applied to the memory cell,
the third voltage is higher than the first voltage and lower than the read voltage,
the fourth voltage is higher than the read voltage and lower than the second voltage,
the third read data has the first value or second value, and
the fourth read data has the first or second value.

9. The system according to claim 8, wherein:
the second controller is configured to:
receive fifth read data which is read from the memory cell with the read voltage applied to the memory cell and has the first or the second value, and
instruct the memory device to write data of the second value in the memory cell when the fifth read data has the first value.

10. A memory system comprising:
a memory device including a memory cell with a variable resistance value, and a first controller configured to compare first read data read from the memory cell when a first voltage is applied to the memory cell with second read data read from the memory cell when a second voltage is applied to the memory cell;
a second controller; and
a second memory cell,
wherein:
the first controller is further configured to:
compare third read data read from with fourth read data, the third read data being the second memory cell with the first voltage applied to the second memory cell, the fourth read data being read from the second memory cell with the second voltage applied to the second memory cell, and
count a first count representing the number of the memory cell in which a value of the first read data is different from a value of the second read data and the second memory cell in which a value of the third read data are different from a value of the fourth read data.

11. The system according to claim 10, wherein:
when the first count exceeds a first reference value and the data read from the memory cell has the first value, data of the second value is written in the memory cell.

12. The system according to claim 11, wherein:
the first controller is further configured to perform a write of data of the second value in the memory cell when the first count exceeds the first reference value and the data read from the memory cell has the first value.

13. The system according to claim 11, wherein:
the second controller is further configured to instruct the memory device to write data of the second value in the memory cell when the first count exceeds the first reference value and the data read from the memory cell has the first value.

14. The system according to claim 10, wherein:
the first controller is further configured to:
compare fifth read data read with sixth read data, the fifth read data read being from the memory cell with a third voltage applied to the memory cell, the sixth read data being read from the memory cell with a fourth voltage applied to the memory cell, the third voltage being higher than the first voltage and lower than the read voltage, the fourth voltage being higher than the read voltage and lower than the second voltage,
compare seventh read data with eighth read data, the seventh read data being read from the second memory cell with the third voltage applied to the second memory, the eighth read data being read from the second memory cell with the fourth voltage applied to the second memory cell, and
count a second count, the second count representing the number of the memory cell in which a value of the fifth data is different a value of the sixth read data and the second memory cell in which a value of the seventh read data is different from a value of the eighth read data.

15. The system according to claim 14, wherein:
the second controller is configured to instruct the memory device to count the second count when the first count exceeds a first reference value.

16. The system according to claim 14, wherein:
the second controller is further configured to instruct the memory device to write data of the second value in the memory cell when the second count is lower than or equal to a second reference and the data read from the memory cell has the first value.

17. A memory system comprising:
a first memory cell with a variable resistance;
a second memory cell with a variable resistance; and
a controller, and
wherein:
data read from the first memory cell has a first value or a second value,
data read from the second memory cell has the first or the second value,
first read data read from the first memory cell has the first value,
first write data to be written in the first memory cell has the second value,
the controller is configured to compare a count with a reference value, the count representing the number of the first memory cell and the second memory cell in which a value of the second read data read from the second memory cell is different from a value of second write data, and
data of the first value is written in the first memory cell when the count exceeds the reference value.

18. The system according to claim 17, further comprising a memory device which includes the first memory cell, the second memory cell and the controller, and a second controller, and
wherein the controller is configured to:
receive the first write data and the second write data from the second controller,
perform a write of data of the first value in the first memory cell when the count exceeds the reference value.

19. The system according to claim 17, further comprising a memory device which includes the first memory cell, the second memory cell and a second controller, and
wherein the second controller is configured to:
receive the first read data and the second read data, and
instruct the memory device to write data of the first value in the first memory cell when a value of the second read data is different from a value of the second write data and the count exceeds the reference value.

* * * * *